United States Patent
Huang et al.

(10) Patent No.: US 11,862,938 B2
(45) Date of Patent: Jan. 2, 2024

(54) SEMICONDUCTOR LASER DIODE

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Van-Truong Dai, Taoyuan (TW); Jhao-Hang He, Taoyuan (TW); Hung-Chi Hsiao, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 217 days.

(21) Appl. No.: 16/898,612

(22) Filed: Jun. 11, 2020

(65) Prior Publication Data
US 2020/0395737 A1 Dec. 17, 2020

(30) Foreign Application Priority Data
Jun. 11, 2019 (TW) ................. 108120190

(51) Int. Cl.
*H01S 5/34* (2006.01)
*H01S 5/343* (2006.01)
(Continued)

(52) U.S. Cl.
CPC ........ *H01S 5/3407* (2013.01); *H01S 5/18311* (2013.01); *H01S 5/2004* (2013.01);
(Continued)

(58) Field of Classification Search
CPC ....... H01S 5/3407; H01S 5/183–18397; H01S 5/34313; H01S 5/3434; H01S 5/3095; H01S 5/18383
See application file for complete search history.

(56) References Cited

U.S. PATENT DOCUMENTS 6,434,178 B1 * 8/2002 Ubukata ................. H01S 5/34
372/45.01
6,782,021 B2 * 8/2004 Huang ................. B82Y 10/00
257/14

(Continued)

FOREIGN PATENT DOCUMENTS

CN 1239600 A 12/1999
CN 103296047 A 9/2013
(Continued)

*Primary Examiner* — Sean P Hagan
(74) *Attorney, Agent, or Firm* — CKC & Partners Co., LLC

(57) ABSTRACT

Provided is a semiconductor laser diode, including a GaAs/In P substrate and a multi-layer structure on the GaAs/InP substrate. The multi-layer structure includes a lower epitaxial region, an active region and an upper epitaxial region. The active region comprises a first active layer, an epitaxial region and a second active layer, the epitaxial region is disposed between the first active layer and the second active layer, the first active layer comprises one or more quantum well structures or one or more quantum dot structures, and the second active layer comprises one or more quantum well structures or one or more quantum dot structures. the epitaxial region further comprises a tunnel junction and at least one carrier confinement layer, at least one carrier confinement layer is disposed between the tunnel junction and the first active layer or between the tunnel junction and the second active layer such that the at least one carrier confinement layer blocks electrons or holes, and no electrons or holes are able to reach the tunnel junction.

18 Claims, 37 Drawing Sheets

(51) Int. Cl.
   *H01S 5/183*  (2006.01)
   *H01S 5/30*   (2006.01)
   *H01S 5/20*   (2006.01)
(52) U.S. Cl.
   CPC ............ *H01S 5/3095* (2013.01); *H01S 5/343* (2013.01); *H01S 5/3406* (2013.01); *H01S 5/3412* (2013.01); *H01S 5/3434* (2013.01); *H01S 5/34353* (2013.01); *H01S 5/3436* (2013.01); *H01S 5/34346* (2013.01); *H01S 5/34373* (2013.01)

(56) References Cited

U.S. PATENT DOCUMENTS

| | | | |
|---|---|---|---|
| 2001/0017875 A1 | 8/2001 | Fukunaga et al. | |
| 2001/0050934 A1 | 12/2001 | Choquette et al. | |
| 2004/0161005 A1* | 8/2004 | Bour | H01S 5/183 372/45.01 |
| 2009/0296768 A1* | 12/2009 | Hara | H01S 5/18355 372/50.124 |
| 2012/0236891 A1* | 9/2012 | Johnson | H01S 5/34313 372/45.01 |
| 2015/0311673 A1* | 10/2015 | Wang | H01S 5/18305 372/27 |
| 2017/0256915 A1* | 9/2017 | Ghosh | H01S 5/18386 |
| 2019/0044304 A1* | 2/2019 | Jayaraman | H01S 5/041 |

FOREIGN PATENT DOCUMENTS

| | | |
|---|---|---|
| CN | 103311805 | 9/2013 |
| CN | 103311805 A | 9/2013 |
| CN | 103548220 A | 1/2014 |
| CN | 109075532 A | 12/2018 |
| CN | 109671770 A | 4/2019 |
| EP | 1220393 | 7/2007 |
| TW | 200742215 A | 11/2007 |

* cited by examiner

SEMICONDUCTOR LASER DIODE

CROSS-REFERENCE TO RELATED APPLICATION

This application claims priority to Taiwanese Application Ser. No. 108120190, filed on Jun. 11, 2019. The entirety of the above-mentioned patent application is hereby incorporated by reference herein and made a part of this specification.

TECHNICAL FIELD

The technical field relates to a semiconductor laser diode, especially a semiconductor laser diode with a lasing wavelength of at least more than 700 nm or 800 nm.

BACKGROUND

Semiconductor laser diodes such as vertical-cavity surface-emitting laser (VCSEL) diodes or edge-emitting laser (EEL) diodes can be used as one of the light sources for 3D sensing, LiDAR and optical communication.

A VCSEL generally includes a pair of high-reflectivity film layers, commonly known as a distributed Bragg reflector (DBR) layer. A resonant cavity is provided between a pair of DBR layers. The resonant cavity usually includes a spacer layer and an active layer. The active layer usually includes a quantum well structure or a quantum dot structure. The quantum well structure is mainly composed of a barrier layer and a well layer. The DBR layer is usually composed of two or more materials with different refractive indexes, which are repeatedly stacked and accurately control the thickness to achieve the effect of high reflectivity. An EEL is to coat a pair of films with different reflectivity on opposite sides of the EEL to form a resonant cavity. The active layer usually contains a quantum well structure or a quantum dot structure. Similar to the VCSEL, the EEL's quantum well structure is mainly composed of a barrier layer and a well layer. An upper photoelectric confinement layer and a lower photoelectric confinement layer are usually provided above and below the active layer.

If the active layer of the semiconductor laser diode is a quantum well structure, the well layer is usually formed of a semiconductor material with a lower bandgap (narrower bandgap), and the barrier layer is composed of a material with a larger bandgap (wider bandgap) than the well layer. Consequently, a quantum well is formed by the bandgap difference between the barrier layer and the well layer. When the laser diode is forward biased, electrons and holes are injected and confined to the quantum well structure, and the injected electrons and holes will recombine in the quantum well to emit light of a specific wavelength. The light produces constructive interference in the resonant cavity, which in turn emits laser light. According to the direction of laser light emission, the laser diode can be categorized into a VCSEL and an EEL. The VCSEL can be further categorized into a top-emitting VCSEL and a bottom-emitting VCSEL.

The VCSEL has the following advantages: (1) narrow-linewidth conical laser beam being easy to couple with optical fiber; (2) fast modulation at a low current level, suitable for high-speed data transmission applications; (3) single-mode output is possible; (4) lower threshold current and lower power consumption; (5) high output power is available; (6) 1D or 2D array designed for the top or bottom light emitting is available; and (7) costs be greatly reduced since the wafer can be tested before packaging.

SUMMARY

Epitaxial growth is performed on a substrate to form a laser diode structure. If the material of the grown epitaxial layer is not lattice-matched to the substrate, strain will be generated in the epitaxial layer, and the accumulated excessive strain in the epitaxial layer may cause defects or dislocations in the epitaxial layer of the laser diode structure, thereby affecting the reliability or power conversion efficiency (PCE) of the laser diode. If an active layer of a laser diode is a quantum well structure, the materials commonly used in a well layer are InGaAs or InAlGaAs. The main purpose of selecting the above-mentioned materials is to improve the optical gain of the active region, to improve the frequency response characteristic of the laser diode or to achieve a specific lasing wavelength. However, the lattice mismatch between the InGaAs or InAlGaAs epitaxial layer and the GaAs substrate is quite large, resulting in greater compressive strain in the active layer and compressive strain accumulation in the epitaxial layer of the laser diode.

When the material of the well layer is not lattice-matched to that of the substrate, strain accumulation will occur in the active layer, resulting in strain accumulated in the laser diode structure. The excessive accumulated strain in the epitaxial layer of the laser diode may cause the generation of defects or dislocations, and resulting in poor reliability of the laser diode. In another respect, poor carrier confinements of the active layer of the laser during high-temperature operation are also problems that must be overcome.

A phosphorus-containing semiconductor layer proposed in the present disclosure can reduce the defects or dislocations of a multi-layer structure or improve the carrier confinement capability of the active layer of the laser diode. In some cases, it has both the aforementioned two effects.

The first exemplary embodiment of the present disclosure relates to a semiconductor laser diode. The semiconductor laser diode may include a GaAs substrate and a multi-layer structure on the GaAs substrate, wherein the multi-layer structure includes an active region and a first semiconductor layer. The active region comprises one or more active layers, wherein at least one of the one or more active layers comprises at least one well layer, and the at least one well layer comprises a material selected from the group consisting of InGaAs, InAlGaAs, GaAsSb, GaAs, AlGaAs, AlGaAsSb, GaAsP and InGaAsP. The first semiconductor layer is provided inside or outside the active region, wherein the first semiconductor layer comprises a material selected from the group consisting of AlGaAsP, AlGaAsPN, AlGaAsPSb, AlGaAsPBi, InAlGaP, InAlGaPN, InAlGaPSb, InAlGaPBi, InGaAsP, InGaAsPN, InGaAsPSb, InGaAsPBi, InGaP, InGaPN, InGaPSb, InGaPBi and InAlGaAsP.

The second exemplary embodiment of the present disclosure relates to a semiconductor laser diode. The semiconductor laser diode may include a GaAs substrate and a multi-layer structure on the GaAs substrate, wherein the multi-layer structure includes an active region, a second semiconductor layer and an intermediate layer. The active region comprises one or more active layers, wherein at least one of the one or more active layers comprises at least one barrier layer and at least one well layer, and the at least one well layer comprises a material selected from the group consisting of InGaAs, InAlGaAs, GaAsSb, GaAs, AlGaAs, AlGaAsSb, GaAsP and InGaAsP. The second semiconductor layer disposed in the at least one barrier layer, wherein the second semiconductor layer is GaAsP. The intermediate layer disposed in the at least one barrier layer and/or between the at least one barrier layer and the at least one well layer, wherein the intermediate layer comprises a material selected from the group consisting of AlGaAsP, AlGaAsPN, AlGaAsPSb, AlGaAsPBi, InAlGaP, InAlGaPN, InAlGaPSb, InAlGaPBi, InGaAsP, InGaAsPN, InGaAsPSb, InGaAsPBi, InGaP, InGaPN, InGaPSb, InGaPBi, InAlGaAsP, GaAs and AlGaAs, wherein a bandgap of the at least one well layer is smaller than bandgaps of the at least one barrier layer and the intermediate layer The third exemplary embodiment of the present disclosure relates to a semiconductor laser diode. The semiconductor laser diode may include a GaAs substrate and a multi-layer structure on the GaAs structure, wherein the multi-layer structure includes a lower epitaxial region, an active region, an upper epitaxial region and at least a carrier confinement layer. The lower epitaxial region is located on the GaAs substrate; the active region is located on the lower epitaxial region; the upper epitaxial region is located on the active region; and the at least one carrier confinement layer is provided in the active region, the lower epitaxial region or the upper epitaxial region, wherein the at least one carrier confinement layer comprises a material selected from the group consisting of AlGaAsP, AlGaAsPN, AlGaAsPSb, AlGaAsPBi, InAlGaP, InAlGaPN, InAlGaPSb, InAlGaPBi, InGaAsP, InGaAsPN, InGaAsPSb, InGaAsPBi, InGaP, InGaPN, InGaPSb, InGaPBi and InAlGaAsP.

The fourth exemplary embodiment of the present disclosure relates to a semiconductor laser diode. The semiconductor laser diode may include a GaAs substrate and a multi-layer structure on the GaAs substrate, wherein the multi-layer structure includes an active region. The active region comprising one or more quantum dot structures, wherein at least one of the one or more quantum dot structures comprises a quantum dot, a wetting layer and a cap layer, wherein the quantum dot and/or the wetting layer comprises a material selected from the group consisting of InGaAs, InAlGaAs, GaAsSb, GaAs, AlGaAs, AlGaAsSb, GaAsP and InGaAsP, and the cap layer comprises a material selected from the group consisting of AlGaAsP, AlGaAsPN, AlGaAsPSb, AlGaAsPBi, InAlGaP, InAlGaPN, InAlGaPSb, InAlGaPBi, InGaAsP, InGaAsPN, InGaAsPSb, InGaAsPBi, InGaP, InGaPN, InGaPSb, InGaPBi and InAlGaAsP.

The fifth exemplary embodiment of the present disclosure relates to a semiconductor laser diode. The semiconductor laser diode may include an InP substrate and a multi-layer structure on the InP substrate, wherein the multi-layer structure includes a lower epitaxial region, an active region, an upper epitaxial region and at least a carrier confinement layer. The lower epitaxial region is located on the InP substrate; the active region is located on the lower epitaxial region, wherein the active region comprises an active layer or a plurality of active layers; the upper epitaxial region is located on the active region; and the at least one carrier confinement layer is provided in the active region, the lower epitaxial region or the upper epitaxial region, wherein the at least one carrier confinement layer comprises a material selected from the group consisting of InGaP, InAlGaP, InP, InAlAsP, AlAsSb, AlAsBi, AlGaAsSb, AlGaAsBi, AlPSb, AlPBi and InGaAsP.

BRIEF DESCRIPTION OF THE DRAWINGS

FIG. 3b is a schematic diagram showing the energy band relationship between the barrier layer and the well layer of FIG. 3a.

FIG. 5b is a schematic diagram showing the energy band relationship between the barrier layer, the intermediate layer and the well layer of FIG. 5a.

FIG. 6a is a schematic diagram showing an embodiment of an intermediate layer of GaAsP inserted in the barrier layer.

FIG. 6b is a schematic diagram showing the energy band relationship between the barrier layer, the intermediate layer and the well layer of FIG. 6a.

FIG. 7b is a schematic diagram showing the energy band relationship between the barrier layer, the intermediate layer and the well layer of FIG. 7a.

DESCRIPTION OF THE EMBODIMENTS

Figure 1A:
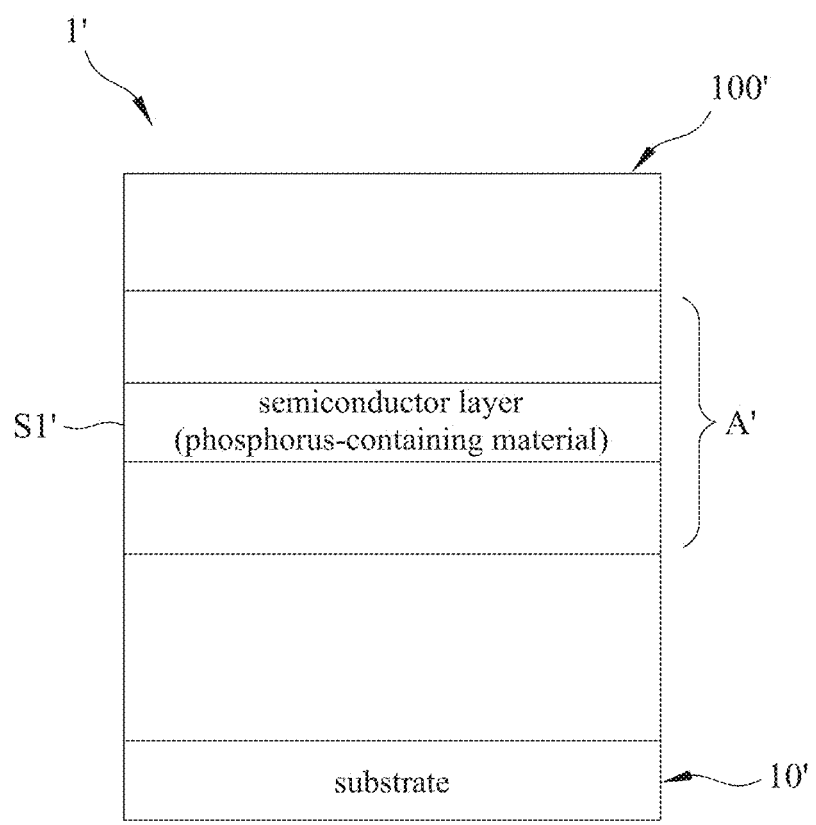
FIGS. 1a-1c show schematic diagrams of the embodiments of phosphorus-containing semiconductor layers disposed in active regions.

The embodiment of the present disclosure is described in detail below with reference to the drawings and element symbols, such that persons skilled in the art is able to implement the present application after understanding the specification of the present disclosure. The thickness ratio between the layers in the drawings is not the actual ratio, and the thickness of each layer should be adjusted according to actual needs.

Specific examples of components and arrangements are described below to simplify the present disclosure. These are, of course, merely examples and they are not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

In the prior art, the laser diode can be optionally provided with a buffer layer according to actual needs, and in some embodiments, the materials of the buffer and the substrate may be the same. Whether the buffer is provided is not substantially related to the technical characteristics to be described in the following embodiments and the effects to be provided. Accordingly, for the sake of a brief explanation, the following embodiments are only described with a laser diode having a buffer layer, and no further description is given to a laser without a buffer layer; that is, the following embodiments can also be applied by replacing a laser diode without a buffer.

A semiconductor laser diode mainly includes a substrate and a multi-layer structure. The multi-layer structure is formed on the substrate. It is well known that for semiconductor laser diode with different application purposes or working principles, the materials of the multi-layer structure and even the substrate will also be different. The phosphorus-containing semiconductor layer proposed in the present disclosure can reduce the defects or dislocations of the multi-layer structure or improve the carrier confinement ability of the laser diode, and even have both of the above effects in some cases. The semiconductor laser diode of the present disclosure refers to a suitable laser diode such as a VCSEL or an EEL, but excludes laser diodes whose lasing wavelength is less than 700 nm.

Figure 1B:
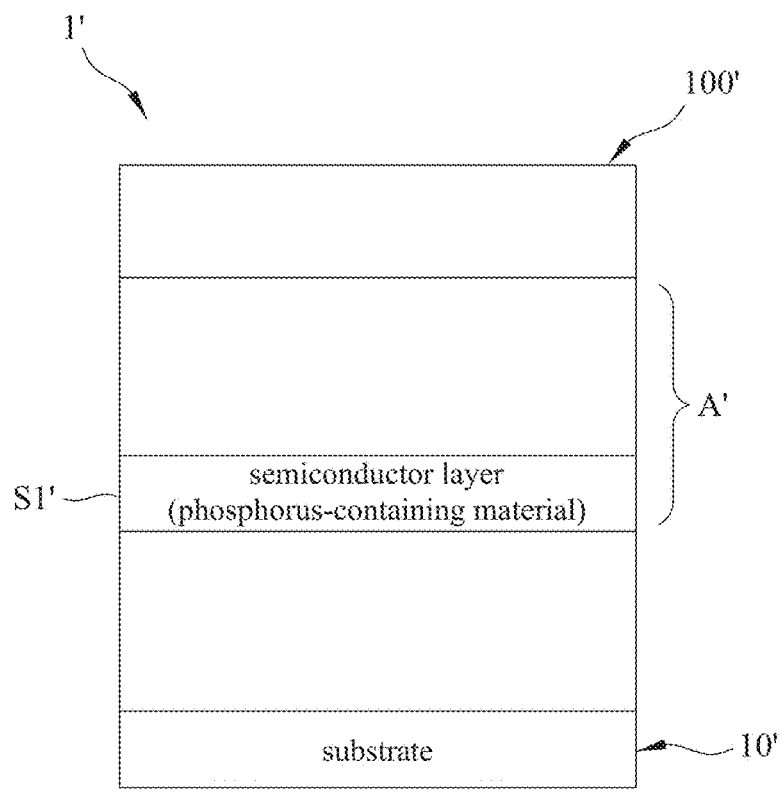
Figure 1C:
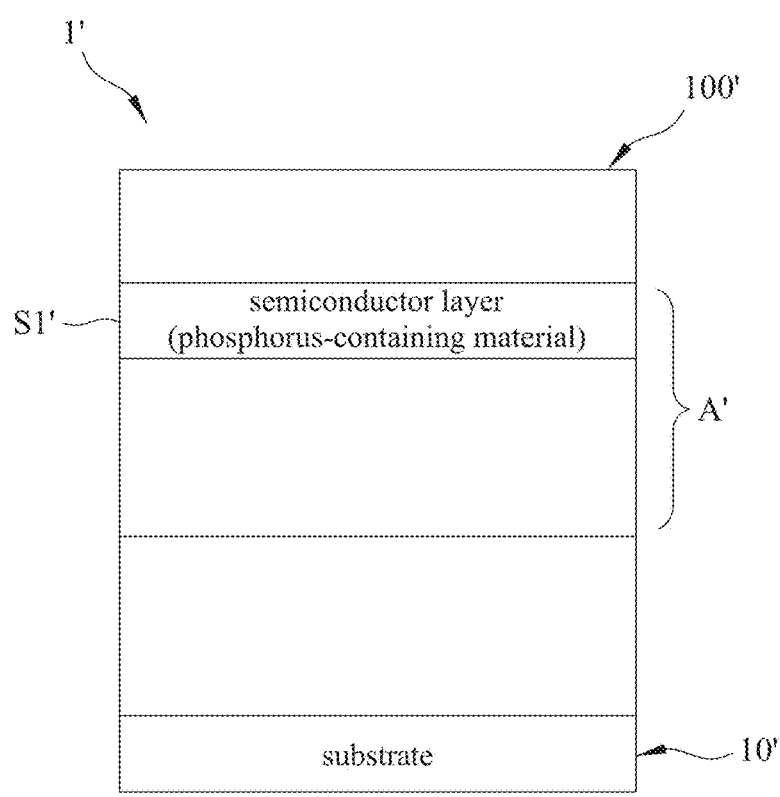
Figure 1D:
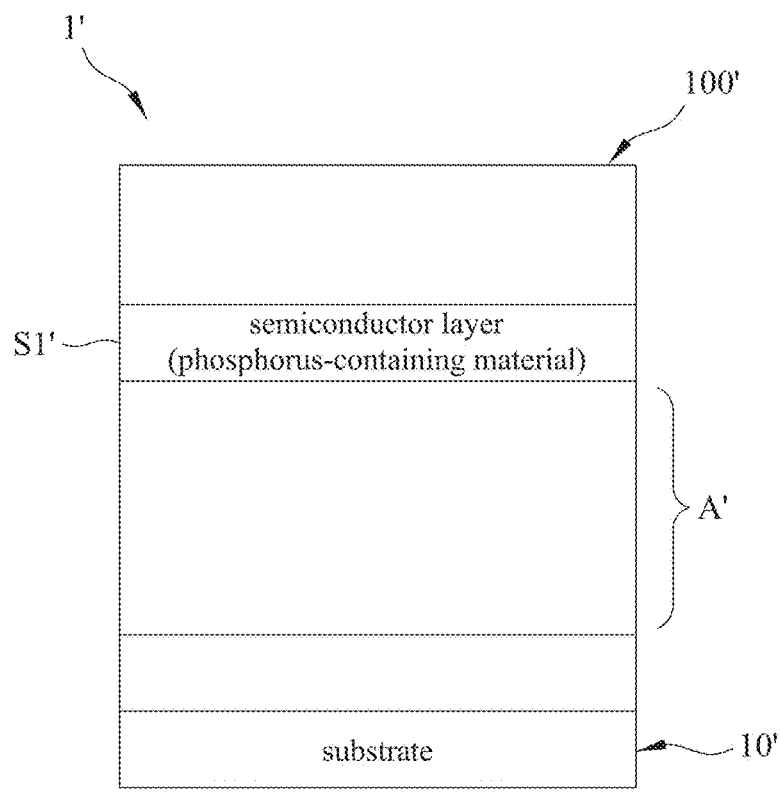
FIGS. 1d-1g show a schematic diagrams of the embodiments of phosphorus-containing semiconductor layers disposed outside active regions.
Figure 1E:
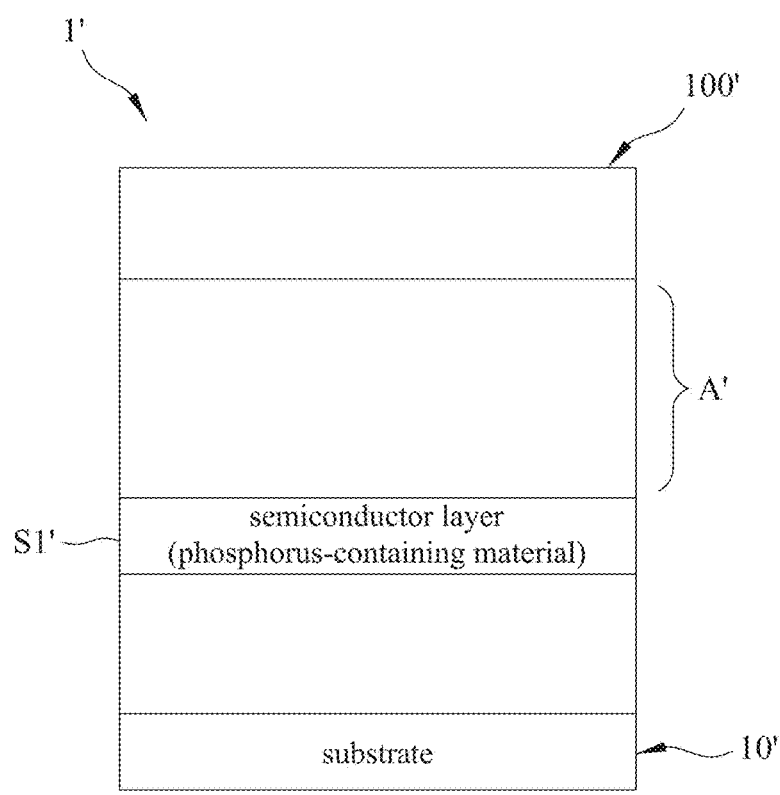
Figure 1F:
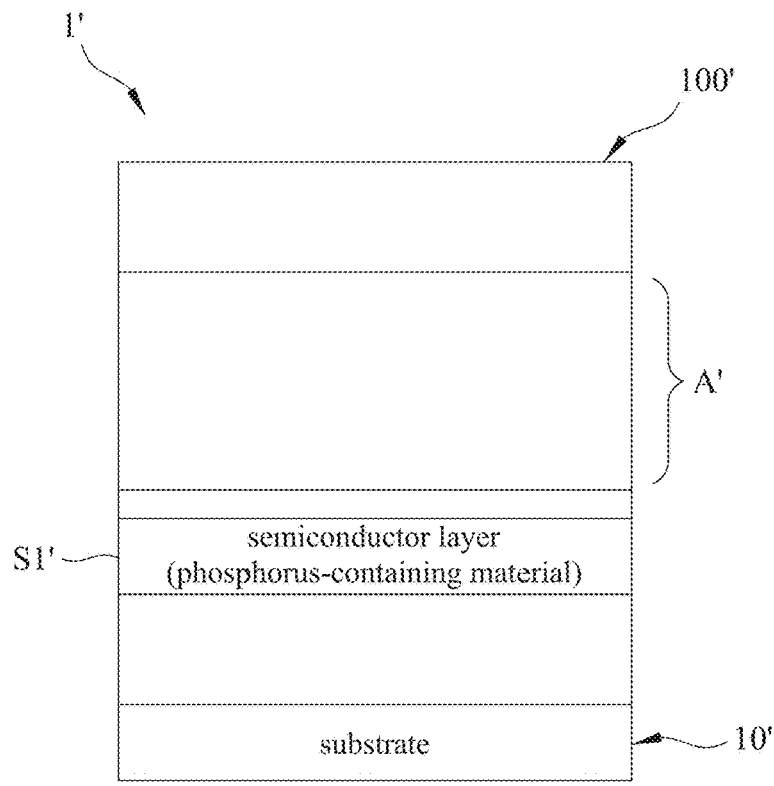
Figure 1G:
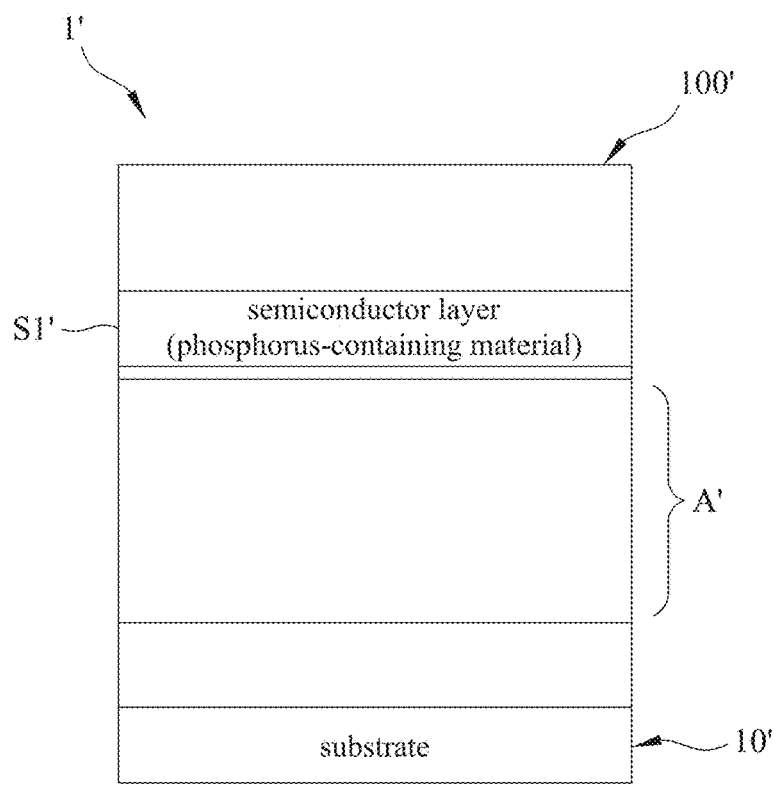

Referring to FIG. 1a, the semiconductor laser diode 1' of the present disclosure mainly includes a substrate 10' and a multi-layer structure 100'. The multi-layer structure 100' is formed on the substrate 10'. The multi-layer structure 100' includes an active region A' and a phosphorus-containing semiconductor layer S1'. Referring to FIGS. 1a and 1b-1c, the phosphorus-containing semiconductor layer S1' may be located at different positions in the active region A'. As shown in FIGS. 1d-1e, the semiconductor layer S1' may be located above or below the active region A', and the semiconductor layer S1' is directly in contact with the active region. As shown in FIGS. 1f-1g, the semiconductor layer S1' may be located above or below the active region A', but the semiconductor layer S1' is indirectly in contact with the active region A'; that is, there is also an epitaxial layer between the semiconductor layer S1' and the active region A'. The specific embodiments are described as follows.

Embodiment 1

Figure 2:
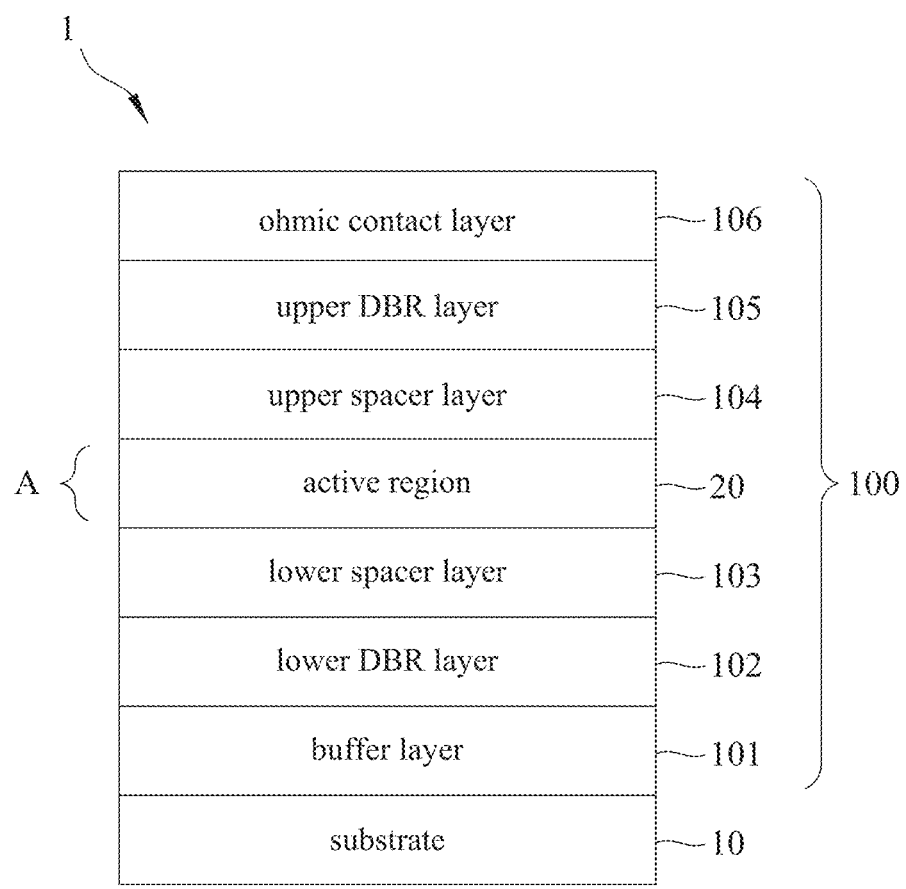
FIG. 2 shows a schematic diagram of an existing VCSEL.
Figure 3B:
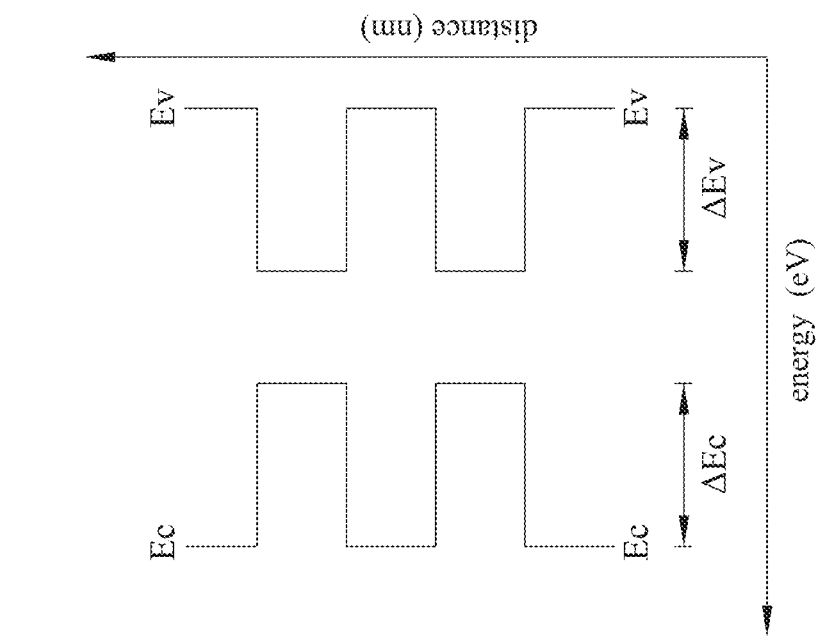
Figure 3A:
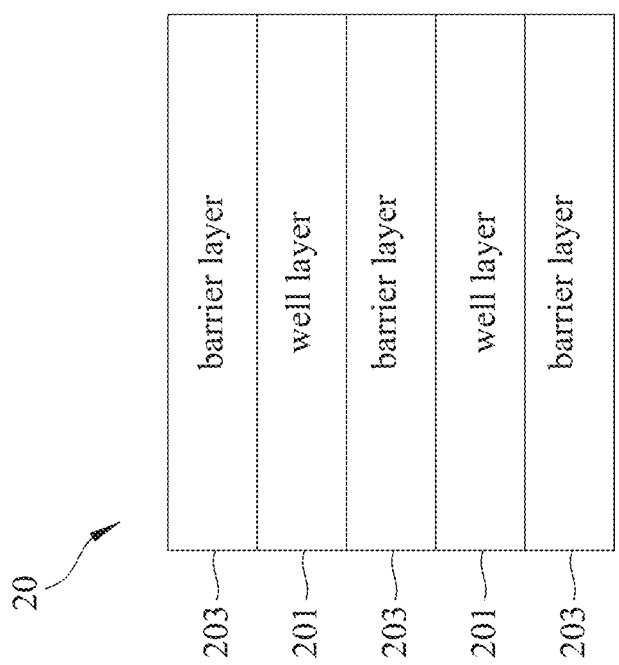
FIG. 3a shows a schematic diagram of an embodiment in which the active layer of FIG. 2 is a quantum well structure.
Figure 4A:
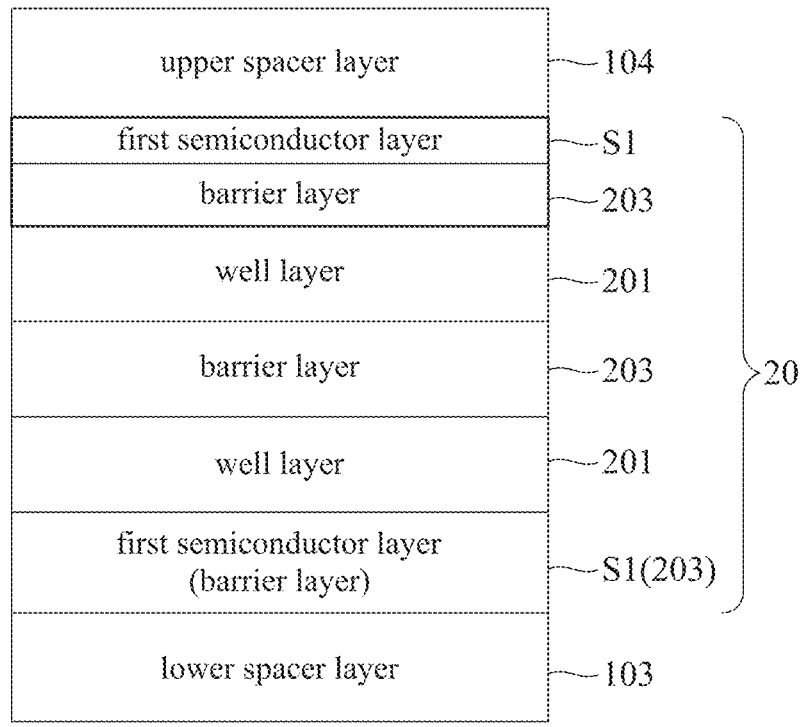
FIG. 4a is a schematic diagram showing a part of or the entire of barrier layer forms the first semiconductor layer.
Figure 4B:
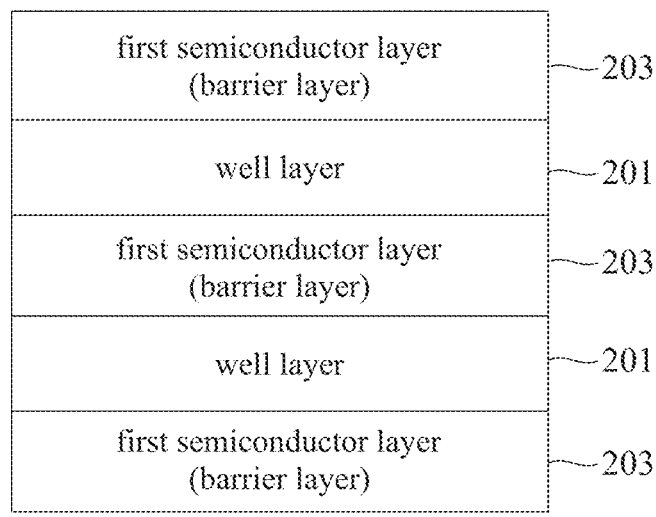
FIG. 4b is a schematic diagram showing an embodiment in which each barrier layer forms a first semiconductor layer.

Referring to FIGS. 2-4b, FIG. 2 is a schematic diagram showing an existing VCSEL. FIG. 3a is a schematic diagram showing an embodiment in which the active layer of FIG. 2 is a quantum well structure. FIG. 3b is a schematic diagram showing the energy bands level of the barrier layer and the well layer of FIG. 3a. FIG. 4a is a schematic diagram showing a part of or the entire of barrier layer forms the first semiconductor layer. FIG. 4b is a schematic diagram showing an embodiment in which each barrier layer forms a first semiconductor layer.

The phosphorus-containing semiconductor layer S1' of FIGS. 1a-1b is referred to as the first semiconductor S1 in Embodiment 1. FIGS. 2 and 3a-3b are related to the structure of the existing VCSEL, and the active layer is a quantum well structure. For specific embodiments of applying the first semiconductor layer to the VCSEL, please refer to FIGS. 4a, 4b and related disclosure.

The semiconductor laser diode shown in FIG. 2 is a VCSEL 1. As shown in FIG. 2, the VCSEL 1 includes a GaAs substrate 10 and a multi-layer structure 100. The active region A of the multi-layer structure 100 includes an active layer 20 (the embodiments of multiple active layers are described later). The multi-layer structure 100 includes a buffer layer 101, a lower DBR layer 102, a lower spacer layer 103, an active layer 20, an upper spacer layer 104, an upper DBR layer 105 and an ohmic contact layer 106 in order from bottom to top. The active layer 20 is provided between the lower spacer layer 103 and the upper spacer layer 104.

The materials of the epitaxial layers (such as the buffer layer 101, the lower DBR layer 102, the lower spacer layer 103, the upper spacer layer 104, the upper DBR layer 105 and the ohmic contact layer 106) may be conventional semiconductor materials. According to actual needs, one or more epitaxial layers may be selectively disposed in the lower DBR layer 102 and/or the upper DBR layer 105, such as an oxidation layer, an ohmic contact layer, a spacer layer or other appropriate epitaxial layers.

As shown in FIG. 3a, in the embodiment of the present disclosure, the active layer 20 may include two well layers 201 and three barrier layers 203. These two well layers 201 and three barrier layers 203 are alternately stacked, but not limited thereto. That is, the active layer 20 may include n well layers 201 and n+1 barrier layers 203. If the active layer 20 is configured in this manner, the uppermost layer and the lowermost layer of the active layer 20 are both barrier layers 203. In some embodiments, the barrier layer 203 at the uppermost layer and the lowermost layer of the active layer 20 may serve as the lower spacer layer 103 or the upper spacer layer 104.

In an embodiment not shown, the active layer 20 may include n well layers 201 and n−1 barriers layer 203. If the active layer 20 is configured in this manner, one of the uppermost layer and the lowermost layer of the active layer 20 is the well layer 201, or both the uppermost layer and the lowermost layer of the active layer 20 are the well layer 201. Preferably, n is an integer of 1 to 5 (that is, the active layer 20 includes at least one well layer), and more preferably, n is an integer of 2 to 5, thereby improving the optical gain or high temperature performance of the VCSEL.

When the uppermost layer or the lowermost layer of the active layer 20 is the well layer 201, the lower spacer layer 103 or the upper spacer layer 104 adjacent to the well layer 201 serves as a barrier layer. When both the uppermost layer and the lowermost layer of the active layer 20 are the well layers 201, the lower spacer layer 103 and the upper spacer layer 104 adjacent to the well layers 201 both serve as barrier layers.

In addition, as shown in the energy band diagram of FIG. 3b, the barrier layer 203 is a semiconductor material with a higher conduction band energy level (Ec), and the well layer 201 is a semiconductor material with a lower conduction band energy level such that a conduction band offset ($\Delta Ec$) occurs in a conduction band and the quantum well is formed. Similarly, a valence band offset ($\Delta Ev$) will also occur in a valence band. When the VCSEL 1 is forward biased, electrons and holes are injected and confined to the quantum well, and the injected electrons and holes recombine in the quantum well and emit light.

In the most embodiments herein, the preferred material of the well layer 201 is InGaAs, InAlGaAs, GaAsSb, GaAs, AlGaAs, AlGaAsSb, GaAsP, InGaAsP or the combination of the above materials. The lasing wavelength of the VCSEL 1 can be adjusted by changing the composition or thickness of the well layer 201 such that the lasing wavelength of the semiconductor laser diode can easily reach 700 nm or more than 800 nm.

However, some of the materials used as the well layer 201 are not lattice-matched to the GaAs substrate 10. In particular, the lattice constants for the materials such as InGaAs, InAlGaAs, GaAsSb, AlGaAs and AlGaAsSb are greater than the lattice constant for the GaAs substrate. Therefore, the well layer will have compressive strain after the epitaxial growth of the well layer, and even if the composition of these materials is changed, the lattice constants therefor will still be greater than the lattice constant for the GaAs substrate. Moreover, the material with lattice constant less than that for the GaAs substrate is GaAsP. Thus, the well layer will have tensile strain after the epitaxial growth of the well layer. Similarly, even if GaAsP change its material composition, the lattice constant for GaAsP will be less than the lattice constant for the GaAs substrate. If some or each well layer in the active layer 20 has compressive strain or tensile strain, the strain will be accumulated in the active layer 20 or VCSEL. Once the accumulated strain in the VCSEL 1 is too large, the epitaxial layer of the VCSEL 1 may have defects or dislocations.

As such, in the multi-layer structure, the first semiconductor layer S1 containing phosphorus is provided. 17 preferred materials as the first semiconductor layer are shown in Table 1. Preferred materials for the first semiconductor layer S1 include at least one of the 17 materials or a combination of at least two materials of the 17 materials in Table 1.

TABLE 1

| first semiconductor layer | AlGaAsP | AlGaAsPN | AlGaAsPSb | AlGaAsPBi |
|---|---|---|---|---|
| | AlGaInP | AlGaInPN | AlGaInPSb | AlGaInPBi |
| | InGaAsP | InGaAsPN | InGaAsPSb | InGaAsPBi |
| | InGaP | InGaPN | InGaPSb | InGaPBi |
| | InAlGaAsP | | | |

The lattice constants for the materials listed above can be changed. For example, by adjusting the composition of the materials, it is determined that the lattice constants for the materials may be equal to, less than or greater than the lattice constant for the GaAs substrate. Therefore, the first semiconductor layer can be determined to induce tensile strain, compressive strain or even no obvious strain according to the strain of the well layer. In this way, the strain of the well layer can be effectively compensated by the first semiconductor layer such that the strain accumulated in the active layer becomes smaller, thereby reducing the probability of defect or dislocations occurrence of the epitaxial layer of the VCSEL and improving the reliability of the VCSEL.

The total strain is calculated by multiplying the strain value of each layer by its thickness to obtain the product value and then subtracting the product value of all compressive strains from the product value of all tensile strains to obtain the total strain (absolute value).

If only the strain of the active layer itself is considered, in principle, as long as the total strain of the active layer itself becomes small enough. In general, the total strain of the active layer becomes small, and the total strain of the VCSEL will also decrease. However, if the epitaxial layer outside the active layer provides considerable strain, the active layer induces appropriate strain and strain magnitude by appropriately selecting the material, material composition, layer number and thickness of the well layer and/or the first semiconductor layer such that the active layer can also moderately compensate the stain of the epitaxial layer outside the active layer.

Taking InGaP in Table 1 as an example, assuming that the mole fraction In:Ga=0.51:0.49, InGaP is lattice-matched to the GaAs substrate. If the lattice constant for InGaP is greater than that for the GaAs substrate, the content of In must be increased (i.e., the content of Ga becomes smaller) such that the first semiconductor layer has compressive strain. If the lattice constant for InGaP is less than that for the GaAs substrate, the content of Ga must be increased (i.e., the content of In becomes smaller) such that the first semiconductor layer can have tensile strain.

In principle, a part of or the entire of the barrier layer 203 is provided with the first semiconductor layer S1. For example, FIG. 4a shows two ways to dispose the first semiconductor layer S1 on the barrier layer. One is to form the first semiconductor layer S1 in a part of the barrier layer 203. As shown in FIG. 4a, the barrier layer 203 is close to the upper spacer layer 104. The other is to form the first semiconductor layer S1 in the whole of the barrier layer 203. As shown in FIG. 4a, the barrier layer 203 is adjacent to the lower spacer layer 103. The above-mentioned first semiconductor layer is partially formed or entirely formed in the barrier layer, and may be applied to one barrier layer or multiple barrier layers. For example, parts of some barrier layers form first semiconductor layers, and other entire barrier layers form first semiconductor layers. As shown in FIG. 4b, each barrier layer is provided with a first semiconductor. It should be noted that the number, arrangement and position of the first semiconductor layer depend on the generation position and magnitude of strain of the well layer, but not limited thereto described in this embodiment.

In this embodiment, by inserting the phosphorus-containing first semiconductor layer S1 into the barrier layer 203, the barrier layer 203 may perform strain compensation on the well layer 201. For example, when the compressive strain is induced in the well layer 201, the first semiconductor layer S1 in the barrier layer 203 has tensile strain such that the total strain accumulated in the active layer 20 becomes smaller. In addition, the barrier layer 203 with the first semiconductor layer S1 may further increase the energy band gap difference between the barrier layer with first semiconductor layer S1 and the well layer, thereby increasing carrier confinement of the active layer. When operating at high temperatures, carriers with higher energy can be confined in quantum wells such that the optical performance of the VCSEL becomes better when operating at high temperature.

It should be noted that the compressive strain or tensile strain induced by the well layer is determined by material of the well layer, the material composition of the well layer or the material of the substrate. If the well layer has tensile strain, the first semiconductor layer should have compressive strain. Similarly, if the well layer has compressive strain, the first semiconductor layer should have tensile strain. If the bandgap of the first semiconductor layer is larger, the carrier confinement capability of the VCSEL can also be improved.

In some embodiments, the thickness of a well layer may preferably be 1 nm to 30 nm, more preferably 2 nm to 15 nm, and still preferably 3 nm to 10 nm, wherein the thickness of a well layer can be adjusted in accordance with the material, material composition or desired wavelength of the well layer.

As described above, the barrier layer 203 may not only perform strain compensation on the well layer 201, but also the strain to which the barrier layer 203 performs strain compensation on the well layer 201 can be adjusted. Specifically, when the material, material composition or thickness of the barrier layer 203 is/are changed, the strain to which the barrier layer 203 performs strain compensation on the well layer 201 can be adjusted. The thickness of a barrier layer 203 may be 1 nm to 30 nm, preferably 2 nm to 15 nm, and still preferably 3 nm to 10 nm so as to reduce or eliminate the strain of the active layer 20.

Embodiment 2

Figure 5B:
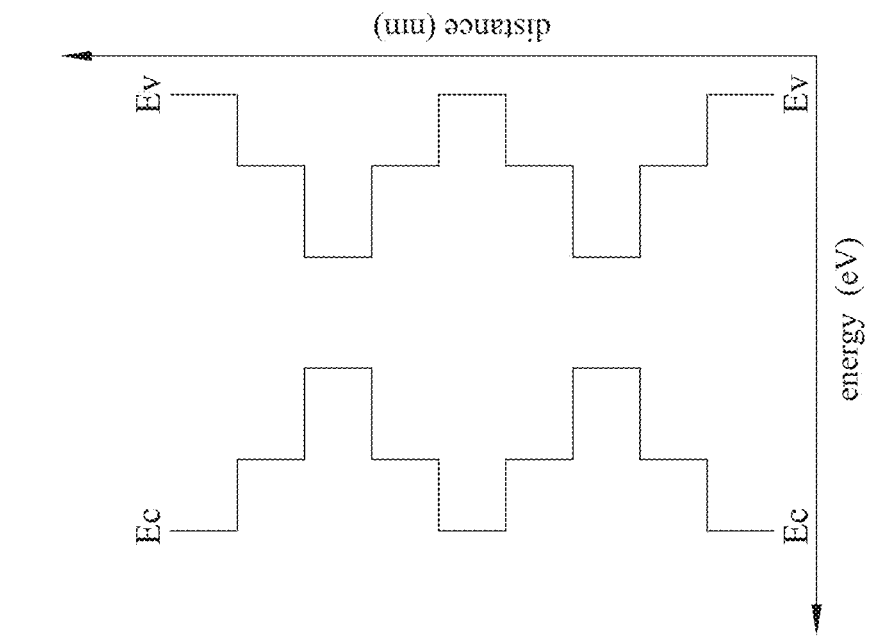
Figure 5A:
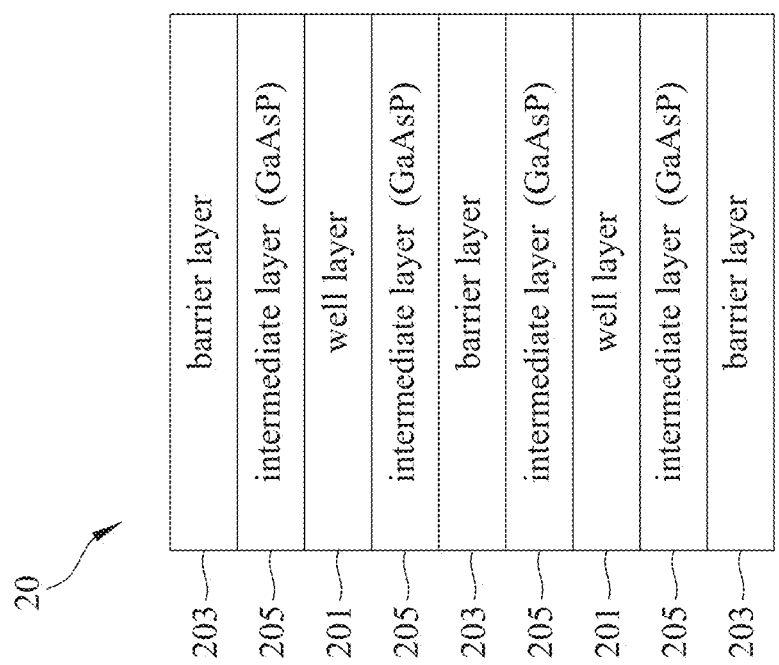
FIG. 5a is a schematic diagram showing an embodiment with an intermediate layer between the barrier layer and the well layer.
Figures 6A, 6B:
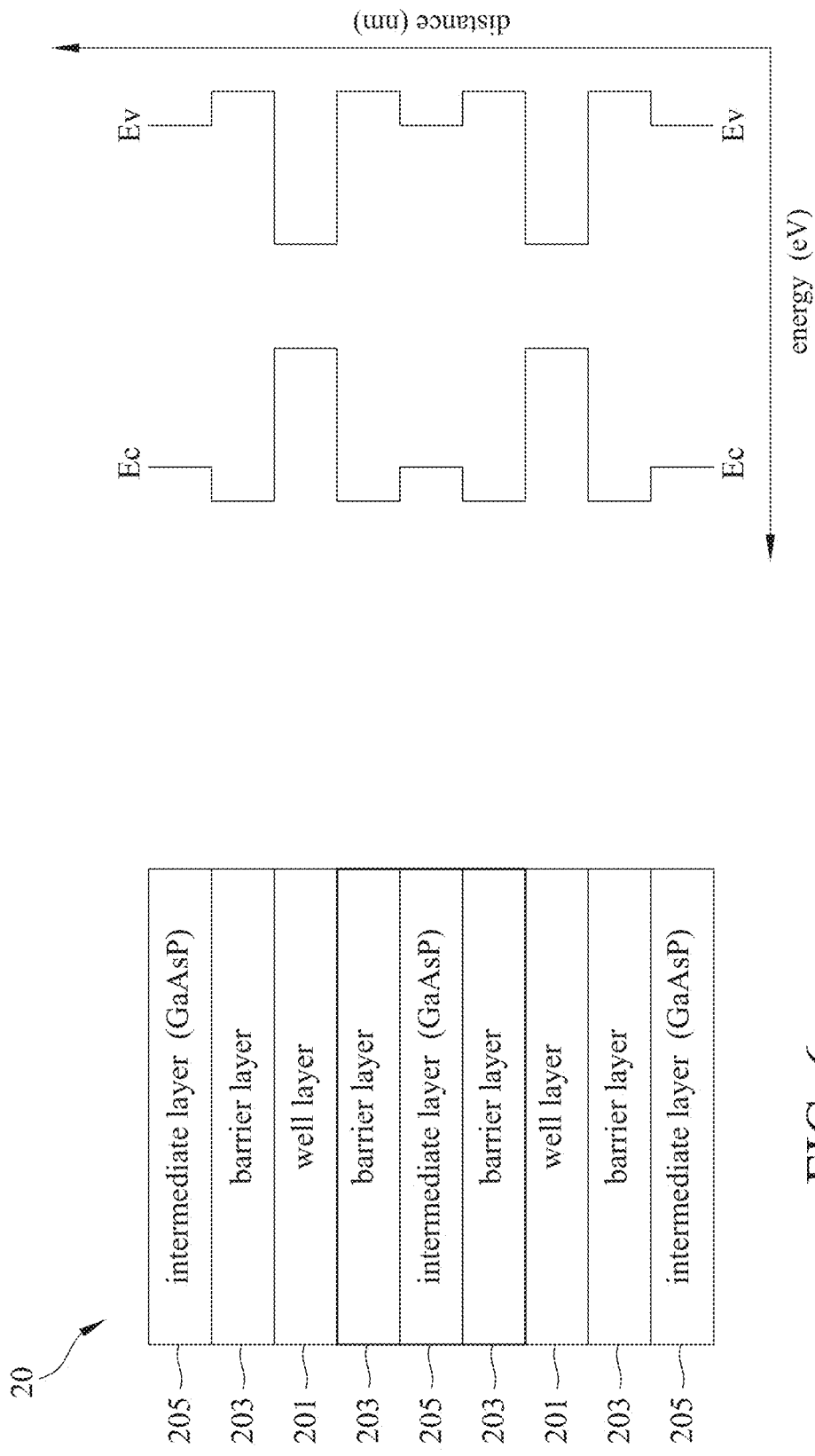
Figure 7B:
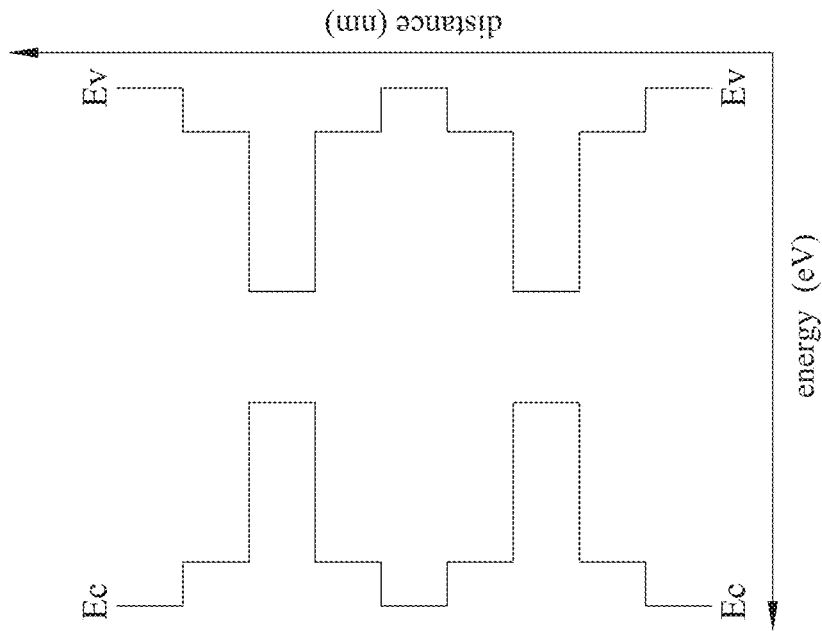
Figure 7A:
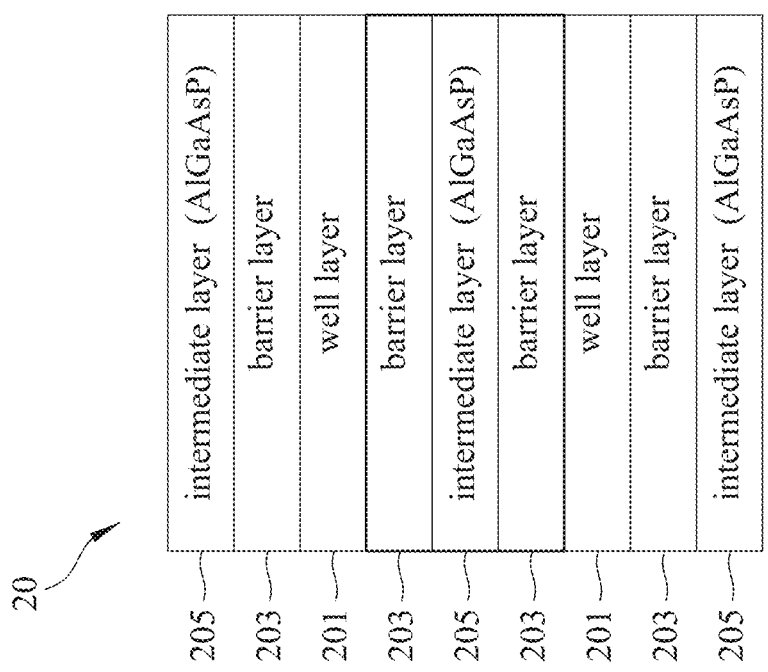
FIG. 7a is a schematic diagram showing an embodiment of an intermediate layer of AlGaAsP inserted in the barrier layer.

FIG. 5a is a schematic diagram showing an embodiment with an intermediate layer between the barrier layer and the well layer. FIG. 5b is a schematic diagram showing the energy band relationship between the barrier layer, the intermediate layer and the well layer of FIG. 5a. FIG. 6a is a schematic diagram showing an embodiment of an intermediate layer of GaAsP inserted in the barrier layer. FIG. 6b is a schematic diagram showing the energy band relationship between the barrier layer, the intermediate layer and the well layer of FIG. 6a. FIG. 7a is a schematic diagram showing an embodiment of an intermediate layer of AlGaAsP inserted in the barrier layer. FIG. 7b is a schematic diagram showing the energy band relationship between the barrier layer, the intermediate layer and the well layer of FIG. 7a.

Compared with FIG. 3a, as shown in FIG. 5a, an intermediate layer 205 is inserted between the well layer 201 and the barrier layer 203, and the barrier layer 203 does not directly contact the well layer 201. Alternatively, as shown in FIG. 6a, an intermediate layer 205 is provided in the barrier layer 203 of the active layer 20; in other words, a layered structure of the barrier layer 203, the intermediate layer 205 and the barrier layer 203 is sequentially formed. Referring to Table 2, there are a total of 20 preferred materials for the intermediate layer 205, and the materials used as the intermediate layer are at least one of the materials or a suitable combination of two or more materials listed in Table 2. Preferably, Embodiment 2 may be used in combination with Embodiment 1; that is, the intermediate layer includes at least one material of Table 2, and the barrier layer includes at least one material of Table 1.

TABLE 2

| intermediate layer | GaAs | AlGaAs | InAlGaAsP | GaAsP |
|---|---|---|---|---|
| | AlGaAsP | AlGaAsPN | AlGaAsPSb | AlGaAsPBi |
| | InAlGaP | InAlGaPN | InAlGaPSb | InAlGaPBi |
| | InGaAsP | InGaAsPN | InGaAsPSb | InGaAsPBi |
| | InGaP | InGaP N | InGaPSb | InGaPBi |

The lattice constants for the materials listed in Table 2 can be changed to be less than, greater than or equal to the lattice constant for the GaAs substrate. Accordingly, the intermediate layer can be determined to have tensile strain, compressive strain or even no strain.

In some embodiments, the materials of the barrier layer 203 and the intermediate layer 205 may be the same or different, and the materials of the barrier layer 203 and the intermediate layer 205 are preferably different. Even if the materials of the barrier layer 203 and the intermediate layer 205 are the same, the composition of the two materials is different. For example, when the materials of the barrier layer 203 and the intermediate layer 205 are AlGaAsP, the composition of aluminum, gallium, arsenic or phosphorus is different.

Although FIG. 5a shows an embodiment in which the uppermost layer and the lowermost layer of the active layer 20 are the barrier layers 203, the uppermost layer and/or the lowermost layer of the active layer 20 may be the well layer 201. When the uppermost layer or the lowermost layer of the active layer 20 is the well layer 201, the well layer 201 may substantially contact the lower spacer 103 or the upper spacer layer 104; when both the uppermost layer and the lowermost layer of the active layer 20 are well layers 201, the well layer 201 may substantially contact the lower spacer layer 103 and the upper spacer layer 104.

In an embodiment, as shown in FIG. 5b, when the intermediate layer 205 is GaAsP, the conduction band energy level of the intermediate layer 205 is between that of the well layer 201 and the barrier layer 203. Since the intermediate layer does not contain aluminum, and is not easily oxidized, the strain of the well layer can be compensated by the intermediate layer. For example, when the well layer has compressive strain, the intermediate layer has tensile strain to reduce the total strain in the active layer.

In some embodiments, as shown in FIGS. 6a and 7a, when the materials of the intermediate layer 205 are GaAsP and AlGaAsP, respectively, the energy band diagrams corresponding to FIGS. 6a and 7a are shown in FIGS. 6b and 7b, respectively. The intermediate layer 205 is not limited to a material that provides tensile strain, and may have a material that provides compressive strain or no obvious strain according to the energy band offset of the quantum well and strain compensation.

The thickness of an intermediate layer 205 may be 1 nm to 30 nm, preferably 2 nm to 15 nm, and still preferably 3 nm to 10 nm, and the total thickness of the intermediate layer 205 and the barrier layer 203 is between two adjacent well layers 201 is between 1 nm and 30 nm, preferably between 2 nm and 15 nm, and still preferably between 3 nm and 10 nm.

In general, the total strain of the well layer, the barrier layer and the intermediate layer of the active layer should be lower than the total uncompensated strain.

Accordingly, the intermediate layer may be determined according to the types and magnitudes of the strain of the well layer and the barrier layer to induce compressive strain, tensile strain or no strain. The total strain can be changed in accordance with the materials, the material composition, layer quantity or thickness of the barrier layer, the intermediate layer, the well layer, but not limited thereto.

Although Embodiment 2 is an intermediate layer provided in an active layer. Similarly, in the embodiment of multiple active layers (multi-junction), Embodiment 2 may also be used in one of multiple active layers, some active layers or each active layer of the laser diode.

Embodiment 3

Figures 8A, 8B:
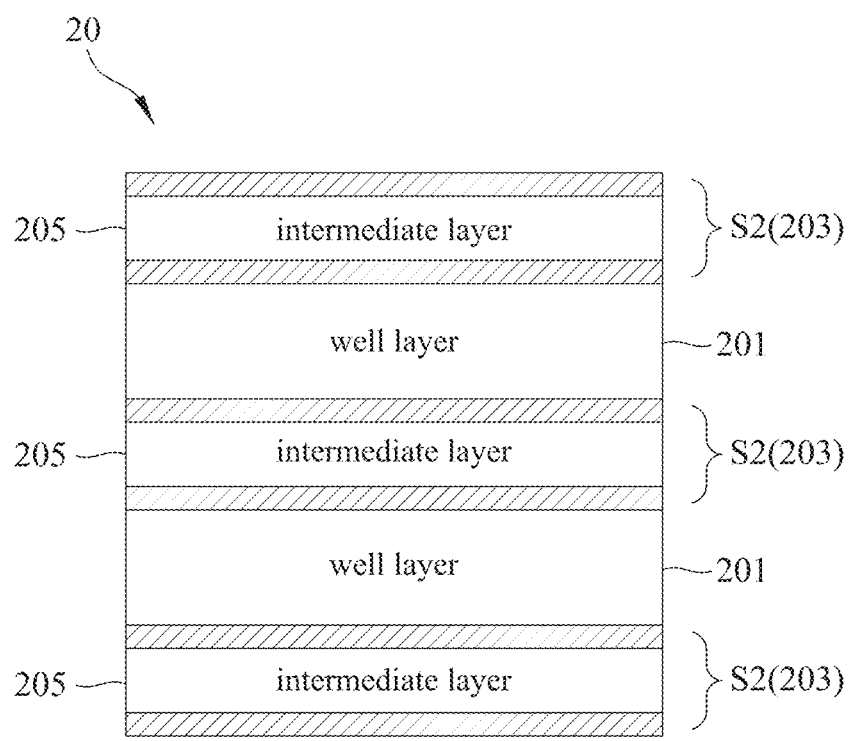
FIG. 8a is a schematic diagram showing an embodiment in which a second semiconductor layer is used as a barrier, and an intermediate layer is disposed between the second semiconductor layer and the well layer.
FIG. 8b shows a schematic diagram of an embodiment in which a second semiconductor layer is used as a barrier layer, and an intermediate is inserted into the barrier layer.

Referring to FIG. 8a, FIG. 8a is a schematic diagram showing an embodiment in which a second semiconductor layer is used as a barrier layer, and an intermediate layer is disposed between the second semiconductor layer and the well layer. Referring to FIG. 8b, FIG. 8b shows a schematic diagram of an embodiment in which the semiconductor a second semiconductor layer is used as a barrier layer, and an intermediate is inserted into the barrier layer.

In Embodiment 3, a VCSEL is taken as an example. The structure of Embodiment 3 is similar to that of Embodiments 1 and 2 in the multi-layer structure 100 and the quantum well structure of the active layer 20.

In terms of materials, the second semiconductor layer S2 and the intermediate layer 205 of Embodiment 3 are different from the first semiconductor S1 and the intermediate layer of Embodiment 1. Specifically, the phosphorus-containing material of the second semiconductor layer S2 is limited to GaAsP, the second semiconductor layer S2 is at least a part of or the entire of the barrier layer 203, and the material of the intermediate layer 205 is at least one or a combination of two or more materials of the 19 materials listed in Table 3. The materials of the well layer 201 are the same as the preferred materials of Embodiment 1. The preferred materials for the well layer are InGaAs, InAlGaAs, GaAsSb, GaAs, AlGaAs, AlGaAsSb, GaAsP, InGaAsP or a combination of the above materials.

TABLE 3

| intermediate layer | GaAs | AlGaAs | InAlGaAsP | |
|---|---|---|---|---|
| | AlGaAsP | AlGaAsPN | AlGaAsPSb | AlGaAsPBi |
| | InAlGaP | InAlGaPN | InAlGaPSb | InAlGaPBi |
| | InGaAsP | InGaAsPN | InGaAsPSb | InGaAsPBi |
| | InGaP | InGaPN | InGaPSb | InGaPBi |

Among the materials listed in Table 3, except that AlGaAs has compressive strain and GaAs does not have strain, the lattice constants of the rest of the materials can be changed to be less than, greater than or even equal to the lattice constant of the GaAs substrate. Therefore, the intermediate layer can be determined to have tensile strain, compressive strain or even no strain.

In some embodiments, when the material of the well layer 201 is InGaAs or InAlGaAs, the optical gain or frequency response of the VCSEL can be further improved. By inserting a GaAsP layer (i.e., the second semiconductor layer) in the barrier layer 203 and the substrate is a GaAs substrate, the GaAsP layer with a lattice constant less than that of the GaAs substrate can induces tensile strain, and strain compensation is performed on the well layer, thereby reducing or eliminating the total strain in the active layer 20. This can improve the reliability of semiconductor laser diode.

In an embodiment, when the conduction band energy level of the intermediate layer 205 is higher than the conductive band energy level of the barrier layer 203 made of GaAsP, the energy band offset between the intermediate layer 205 and the well layer 201 will be greater than the energy band offset between the GaAsP barrier layer 203 and the well layer 201. This can improve the carrier confinement ability of quantum wells, the high-temperature performance or reliability of the semiconductor laser diode.

Although Embodiment 3 takes the well layer, the barrier layer and the intermediate layer in an active layer as an example. Similarly, in the embodiment of multi-active layer (multi-junction), Embodiment 3 can also be used in an active layer, some active layers or each active layer in the multi-active layer of the laser diode.

Embodiment 4

The materials of the well layer and the intermediate layer and the barrier layer are InGaAs, AlGaAs and GaAsP, respectively. The AlGaAs intermediate layer is provided in the GaAsP barrier layer. GaAsP can provide tensile strain, reduce the total strain of the active layer and the semiconductor laser diode, and reduce the dislocation or defects of the epitaxial layer in the semiconductor laser diode. AlGaAs can increase the energy band offset to the well layer, thereby enhancing the carrier confinement ability of quantum wells to improve the high-temperature performance of the semiconductor laser diode.

Embodiment 5

The materials of the well layer and the barrier layer are InGaAs and AlGaAsP, respectively (no intermediate layer provided). The AlGaAsP barrier layer can provide tensile strain, reduce the total strain of the active layer or the semiconductor laser diode, and reduce the defects or dislocation of the epitaxial layer in the semiconductor laser diode. The AlGaAsP barrier layer can increase the energy band offset to the InGaAs well layer, thereby improving the carrier confinement ability of quantum wells to improve the high-temperature performance of the semiconductor laser diode. Alternatively, when it is no longer necessary to increase the energy band offset to the quantum well, the aluminum content of the AlGaAsP barrier layer can be appropriately lowered, and the probability of the active layer of the semiconductor laser diode being oxidized also becomes lower, thereby improving the reliability of the semiconductor laser diode.

Embodiment 6

Figure 9:
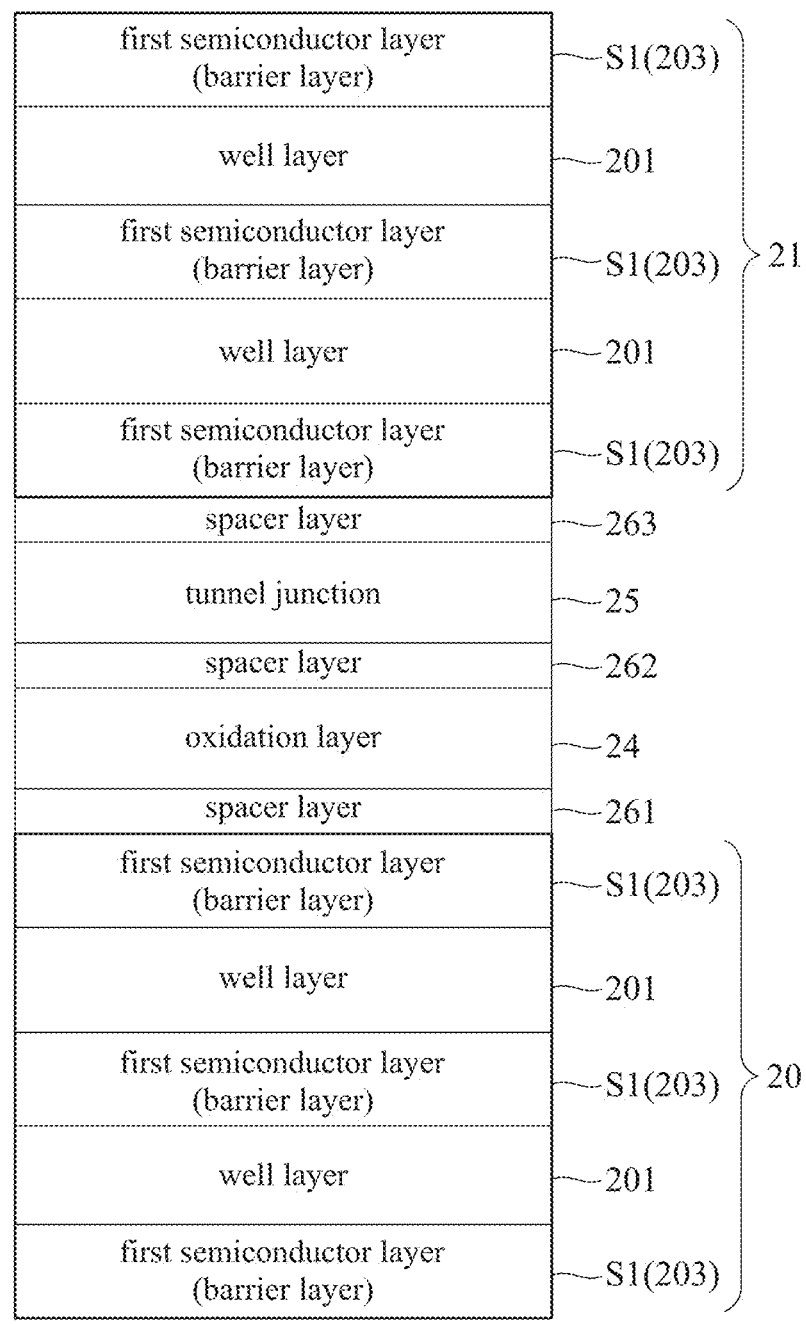
FIG. 9 is a schematic diagram illustrating an embodiment of a VCSEL having an active region with multiple active layers.

Referring to FIG. 9, FIG. 9 is a schematic diagram illustrating an embodiment of a VCSEL having an active region with multiple active layers (multi-junction VCSEL).

As shown in FIG. 9, the active region A includes active layers 20 and 21. At least one of the embodiments of the first semiconductor layer S1 of Embodiment 1, the intermediate layer of Embodiment 2 and the second semiconductor layer S2 of Embodiment 3 can be applied to the active layers 20 and/or 21. Please refer to the foregoing for the related disclosure. It should be noted that in the embodiment of the multi-active layer (multi-junction), as shown in in Table 4, the material of the first semiconductor layer includes GaAsP in addition to the 17 materials listed in Table 1.

TABLE 4

| first semiconductor layer | AlGaAsP | AlGaAsPN | AlGaAsPSb | AlGaAsPBi |
|---|---|---|---|---|
| | InAlGaP | InAlGaPN | InAlGaPSb | InAlGaPBi |
| | InGaAsP | InGaAsPN | InGaAsPSb | InGaAsPBi |
| | InGaP | InGaPN | InGaPSb | InGaPBi |
| | InAlGaAsP | GaAsP | | |

The number of multiple active layers is not limited to two layers, but may also be three layers, four layers or more than five layers, in which there is an epitaxial region between two adjacent active layers or any two adjacent active layers. In some embodiments, the tunnel junction 25 is at least provided in the epitaxial region. The multiple active layers help to improve the optical output power and power conversion efficiency, but the greater the number of active layers, the easier the strain is to accumulate. By appropriately determining the materials, material composition, layer quantity or thickness of the well layer, the first semiconductor layer S1 or the second semiconductor layer S2, the total strain of the active layers or VCSEL can be reduced.

Although FIG. 9 also shows that the oxidation layer 24 and the spacer layers 261-263 are further provided in the epitaxial region, the oxidation layer 24 or the spacer layers 261-263 are selectively configured according to actual needs. For example, the spacer layers 261-263 are usually used to adjust the optical phase or as an optical confinement layer or as a carrier confinement layer. FIG. 9 shows a preferred embodiment of the oxidation layer 24 and the spacer layers 261-263. The spacer layers 261, 262 and 263 may be inserted between the active layer 20 and the oxidation layer 24, between the oxidation layer 24 and the tunnel junction 25 and between the tunnel junction 25 and the active layer 21. In the case of three or more active layers, an oxidation layer and/or a spacer layer may be selectively or further formed between any two adjacent active layers. The specific implementation of the oxidation layer and/or the spacer layer can be changed according to actual needs, in addition to the foregoing.

In some embodiments, the first semiconductor layer is provided in the spacer layers 261, 263 adjacent to the active layer 20 and/or the active layer 21; or the first semiconductor layer is provided in the active layer. The specific implementation of the first semiconductor layer is as described in Embodiment 1, 2 or 3.

In the prior art, common materials for the barrier layer are AlGaAs, GaAsP and GaAs. Compared with GaAsP or GaAs, the carrier confinement can be improved due to the large energy band offset between AlGaAs and the well layer. Therefore, when operating at high temperature, AlGaAs barrier is able to confine the carriers better in the quantum well such that the optical performance of VCSEL becomes better. However, when the material of the barrier layer is AlGaAs, the barrier layer will have compressive strain. If the well layer also has compressive strain, excessive compressive strain will be accumulated in the active layer, and will cause the epitaxial layer of the VCSEL to be prone to defects or dislocations, thus resulting in poor reliability of the VCSEL. When there are too many defects or dislocations, the optical performance of the VCSEL will deteriorate. Although increasing the aluminum content in the barrier layer may increase the energy band offset to improve carrier confinement of the quantum well, however, as the aluminum content increase, the probability of the active layer being oxidized tends to increase. Since the oxidation of aluminum in the active layer causes defects in the active layer, the optical performance or reliability of the VCSEL will be deteriorated.

When the material of the barrier layer is AlGaAsP (the material listed in Table 1), and compared to the material of the barrier layer being AlGaAs, when the aluminum compositions of the AlGaAsP barrier layer and the AlGaAs barrier layer are exactly the same and the materials of the well layers are also exactly the same, the energy band offset between the AlGaAsP barrier layer and the well layer will be larger than the energy band offset between the AlGaAs barrier layer and the well layer, the carrier confinement will also be increased.

When the material of the barrier layer is AlGaAs, the energy band offset to the well layer can only be increased by increasing the aluminum composition of AlGaAs, but the higher the aluminum composition, the easier the barrier layer is to be oxidized. After the first semiconductor layer S1 containing phosphorus is provided in the barrier layer, the oxidation rate of the barrier layer containing phosphorus will be slower than that of the barrier layer not containing phosphorus when the aluminum composition (content) is the same. In addition, in the case of the same aluminum content, the energy band offset between AlGaAsP barrier layer and the well layer is greater than that between AlGaAs barrier layer and the well layer. Therefore, the aluminum content of AlGaAsP does not need to be as much as that of AlGaAs for the same energy band offset. Additionally, AlGaAsP increases the energy band offset to the well layer by increasing the phosphorus content such that the aluminum content can be further reduced. Accordingly, the probability of the active layer of the VCSEL 1 being oxidized is lowered, the occurrence of defects of the active layer or the VCSEL can be further lowered so as to improve the reliability of the VCSEL. The amount of phosphorus and aluminum can be adjusted according to the energy band offset of the quantum well and the strain compensation.

Similarly, when the first semiconductor layer formed in the barrier layer 203 uses any of the other phosphorus-containing materials listed in Table 1, it also has the effect of increasing the reliability of the VCSEL.

Embodiment 7

Figure 10A:
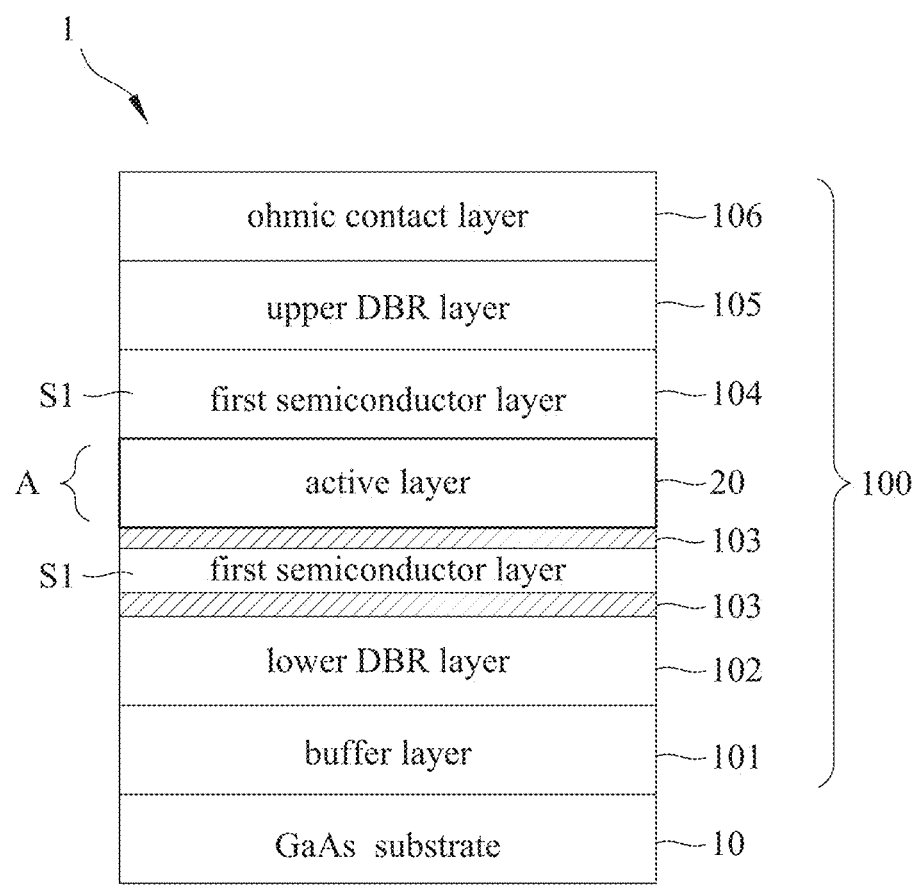
FIG. 10a is a schematic diagram showing an embodiment in which a first semiconductor layer is formed above and below an active layer.
Figure 10B:
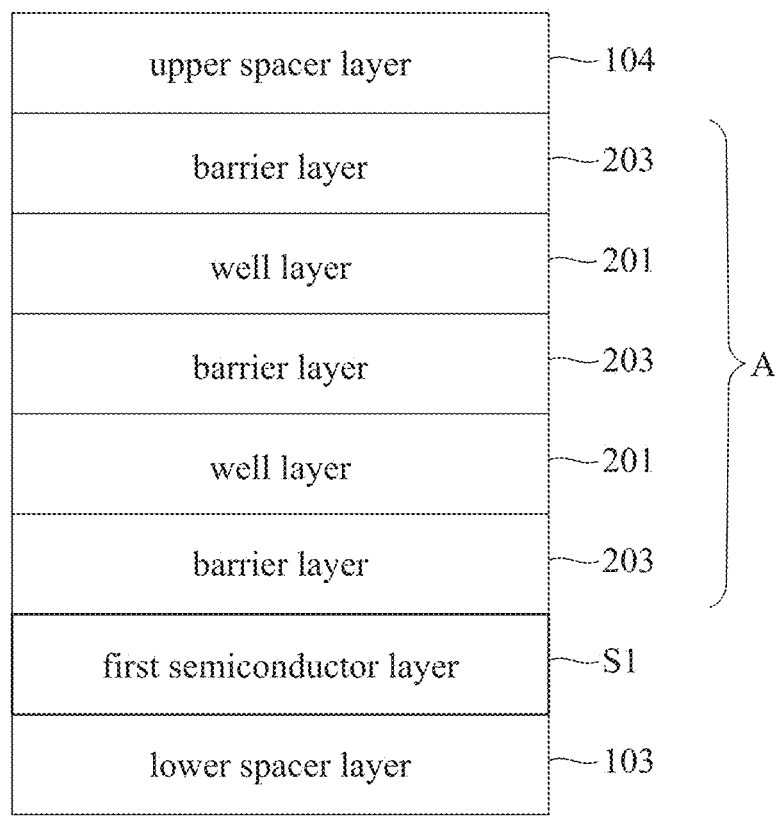
FIG. 10b shows a schematic diagram of an embodiment in which the first semiconductor is formed between the active layer and the lower spacer layer.

FIG. 10a is a schematic diagram showing an embodiment in which a first semiconductor layer is formed above and below an active layer. FIG. 10b shows a schematic diagram of an embodiment in which the first semiconductor is formed between the active layer and the lower spacer layer.

FIGS. 10a and 10b show a VCSEL as an example. As shown in FIG. 10a, the first semiconductor S1 is provided above and below the active region. The material of the first semiconductor layer above and/or below the active region is at least one of the materials or a combination of at least two materials listed in Table 5. The 20 materials listed in Table 5 include the 17 materials in Table 1 and GaAsP, AlGaAs and GaAs.

TABLE 5

| AlGaAsP | AlGaAsPN | AlGaAsPSb | AlGaAsPBi |
|---------|----------|-----------|-----------|
| AlGaInP | AlGaInPN | AlGaInPSb | AlGaInPBi |
| InGaAsP | InGaAsPN | InGaAsPSb | InGaAsPBi |
| InGaP | InGaPN | InGaPSb | InGaPBi |
| InAlGaAsP | GaAsP | AlGaAs | GaAs |

In some embodiments, as shown in FIG. 10a, the entire upper spacer layer 104 is the first semiconductor layer S1, and one surface of the first semiconductor layer S1 is substantially in contact with the active layer 20. Alternatively, a part of the lower spacer layer 103 is provided with the first semiconductor layer S1, and the first semiconductor layer S1 may not be substantially in contact with the active layer 20, that is, a part of the lower spacer layer 103 is between the first semiconductor layer S1 and the active layer 20. Whether the lower spacer layer 103 or the upper spacer layer 104 directly or indirectly contacts the active layer 20 depends on implementation needs. When the first semiconductor layer S1 is in the lower spacer layer 103 or the upper spacer layer 104, whether the first semiconductor layer S1 directly or indirectly contacts the active layer 20 depends on implementation needs.

In some embodiments, the materials of the "upper spacer layer and first semiconductor layer" or the "lower spacer layer and first semiconductor layer" may be the same or different. Even if the materials of the "upper spacer layer and first semiconductor layer" or the "lower spacer layer and first semiconductor layer" are the same, the composition of these two materials may be different.

In some embodiments, as shown in FIG. 10b, the first semiconductor layer S1 is formed between the lower spacer layer 103 and the active layer 20, but not limited thereto. The first semiconductor layer S2 may also be formed between the upper spacer layer 104 and the active layer 20 (not shown).

In the case that the first semiconductor layer S1 is in indirect contact with the active layer, in principle, the closer the first semiconductor S1 is to the active layer 20, the more obvious the effect of the carrier confinement capability or strain compensation of the active layer 20 is improved. However, it is not limited that the first semiconductor layer S1 must be in contact with or adjacent to the active layer. If the upper or lower spacer layer is thin enough or the first semiconductor layer provides sufficient strain, even if there is an epitaxial layer between the first semiconductor layer and the active layer, a certain carrier confinement capability to the active layer or reduce the total strain of the active layer or the VCSEL can still be provided by the first semiconductor layer.

It is worth noting that when the first semiconductor layer S1 is disposed outside the active layer 20, the barrier layer or the intermediate layer of the active layer may use conventional materials, or another first semiconductor layer is provided in the active layer. Please refer to the first semiconductor layers of Embodiments 1-3 with respect to the specific implementation of another first semiconductor layer.

When the well layer or the epitaxial layer of the laser diode has considerable strain, by applying any of the above-mentioned embodiments or a combination of some embodiments to the laser diode, the strain of the active layer or the laser diode is controlled within a certain range. In the above embodiments, for example, some materials in Table 1 will have obvious carrier confinement effects under appropriate conditions. Although some contents about the carrier confinement are mentioned in the foregoing, they are scattered in different places in the foregoing. Therefore, some preferred embodiment with respect to the carrier confinement will be described in detail as follows.

Embodiment 8

Figure 11A:
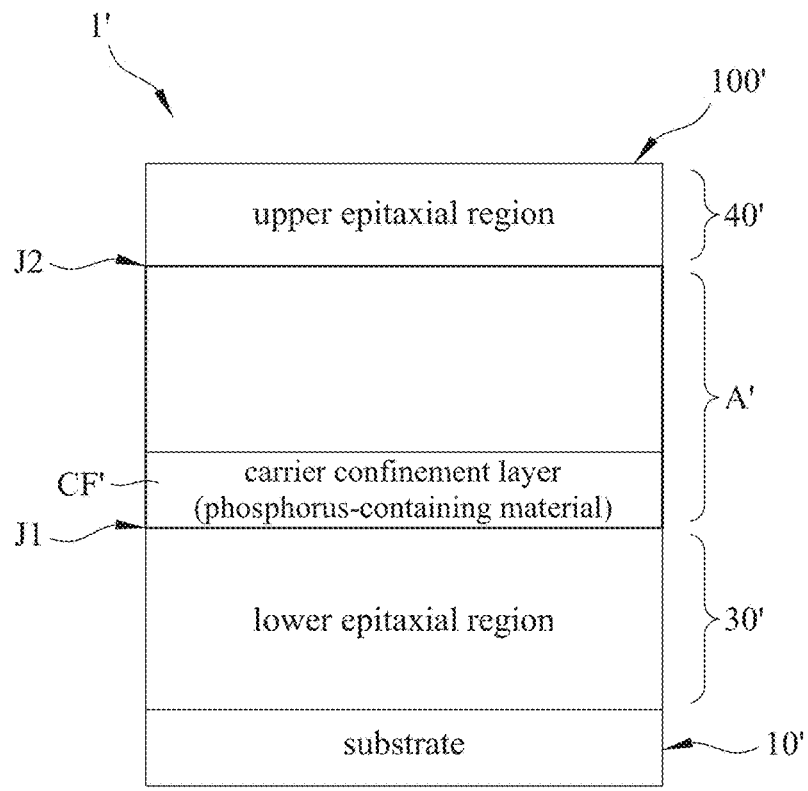
FIG. 11a shows a schematic diagram of an embodiment of the carrier confinement layer in the active region.
Figure 11B:
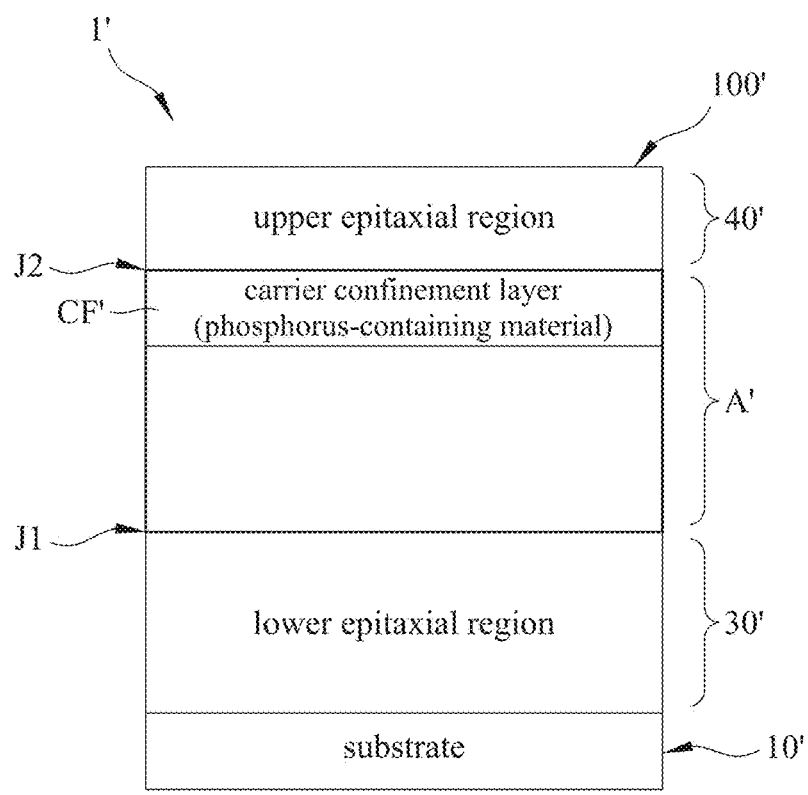
FIG. 11b is a schematic diagram showing another embodiment of the carrier confinement layer in the active region.
Figure 11C:
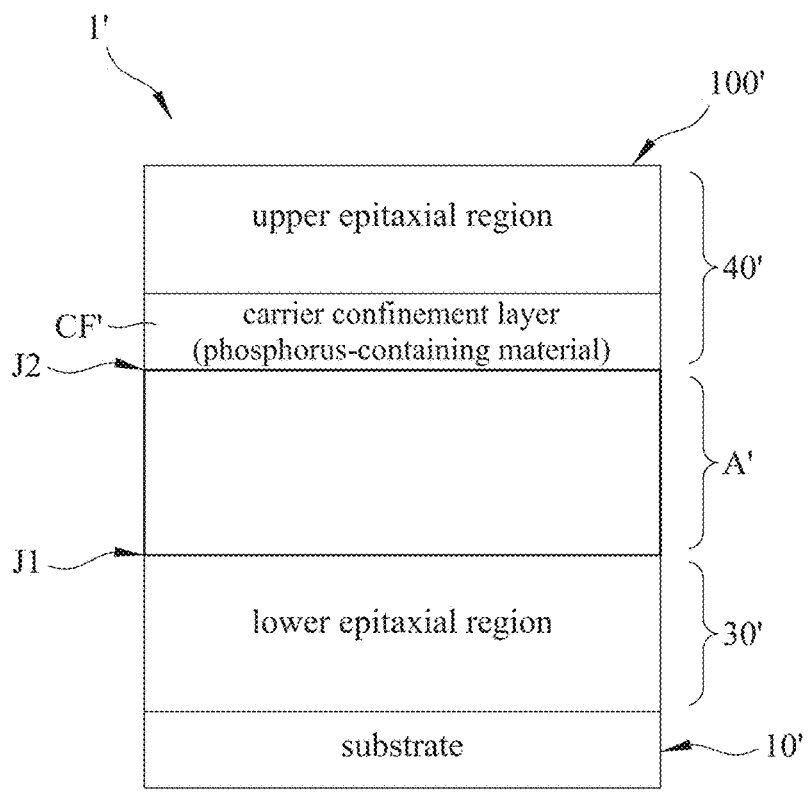
FIG. 11c shows a schematic diagram of an embodiment of the carrier confinement layer outside the active layer.
Figure 11D:
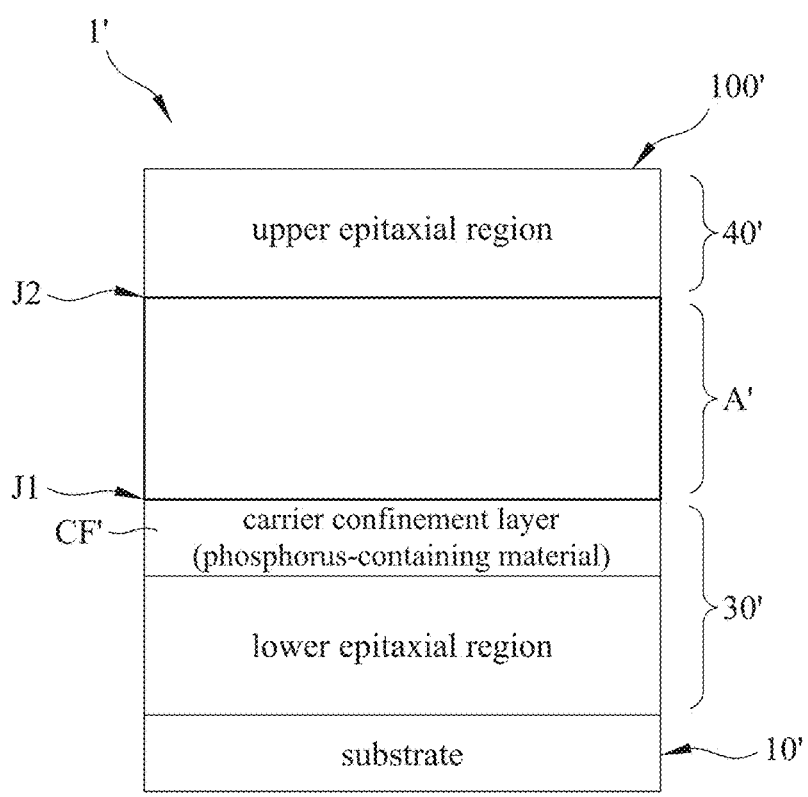
FIG. 11d is a schematic diagram showing another embodiment of the carrier confinement layer outside the active region.

FIG. 11a shows a schematic diagram of an embodiment of the carrier confinement layer in the active region, FIG. 11b is a schematic diagram showing another embodiment of the carrier confinement layer in the active region, FIG. 11c shows a schematic diagram of an embodiment of the carrier confinement layer outside the active layer, and FIG. 11d is a schematic diagram showing another embodiment of the carrier confinement layer outside the active region.

FIGS. 11a-11d are substantially the same as FIGS. 1b-1e, in which the phosphorus-containing semiconductor layer S1' is uniformly referred to as the carrier confinement layer CF' in Embodiment 8, and the active layer A' shown in FIGS. 11a-11d includes one active layer. With regard to the embodiments of the multi-active layer, please refer to the following Embodiments 12-15.

As shown in FIGS. 11a-11d, the multilayer structure includes an active region A', a lower epitaxial region 30' and an upper epitaxial region 40'. The lower epitaxial region 30' and the upper epitaxial region 40' are disposed below and above the active region A'. The surface of the active region A' facing the lower epitaxial region 30' is defined as the first surface J1, and the surface of the active region A' facing the upper epitaxial region 40' is defined as the second surface J2. In the following, if it is called "the surface of the active layer" alone, it represents the first surface and/or the second surface. In the embodiments of the multi-active layer, it will also include the third surface, the fourth surface and the Nth surface as well as "the surface of the active layer" represents one, two or more of the first to Nth surfaces.

When the carrier confinement layer CF' is disposed in the active region A', in this configuration, whether the carrier confinement layer CF' is substantially in contact with or close to the lower epitaxial region 30' or the upper epitaxial region 40' and the carrier confinement layer CF' will have carrier confinement effects. In some embodiments, the carrier confinement layer CF' may even disposed in one barrier layer or barrier layers of the active layer.

When the carrier confinement layer CF' is disposed in the lower epitaxial region 30' or the upper epitaxial region 40', in this configuration, in principle, the closer the carrier confinement layer CF' is to the active region A', the more obvious the carrier confinement effect is improved. In some embodiments, one surface of the carrier confinement layer can be seen as the first surface J1 or the second surface J2; that is, the carrier confinement layer is formed as the uppermost part of the lower epitaxial region or as the lowermost part of the upper epitaxial region, or the carrier confinement layer constitutes the lowermost or uppermost part of the active region. In other words, the carrier confinement layer is disposed between the lower epitaxial region and the active region or between the active region and the upper epitaxial region.

In some embodiments, there is also a part of an epitaxial layer, an epitaxial layer or some epitaxial layers between the carrier confinement layer and the first surface J1 or between the carrier confinement layer and the second surface J2. Preferably, the material of the carrier confinement layer CF' is at least one material or a combination of more than two materials listed in Table 6.

TABLE 6

| carrier confinement layer | AlGaAsP | AlGaAsPN | AlGaAsPSb | AlGaAsPBi |
|---|---|---|---|---|
| | AlGaInP | AlGaInPN | AlGaInPSb | AlGaInPBi |
| | InGaAsP | InGaAsPN | InGaAsPSb | InGaAsPBi |
| | InGaP | InGaPN | InGaPSb | InGaPBi |
| | InAlGaAsP | | | |

Embodiment 9

Figure 12A:
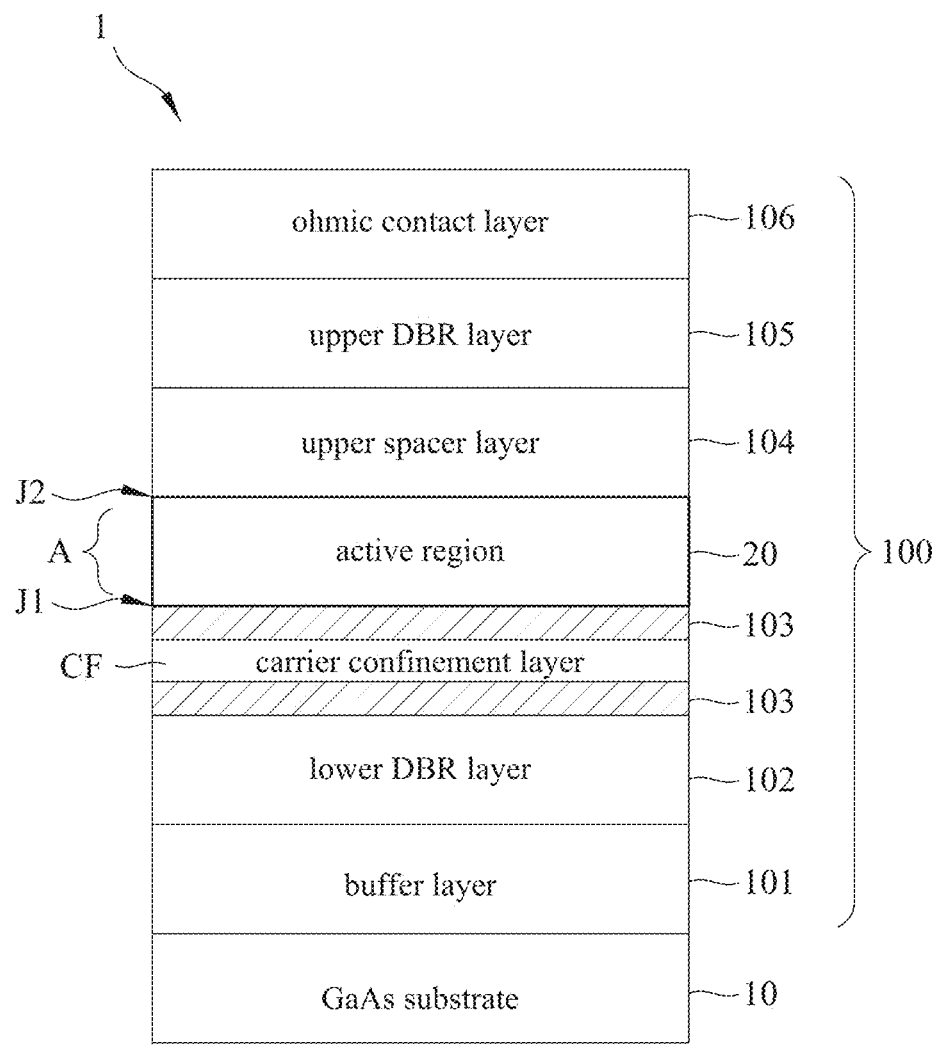
FIG. 12a is a schematic diagram showing an embodiment in which a carrier confinement layer is provided in a part of a lower spacer layer.
Figure 12B:
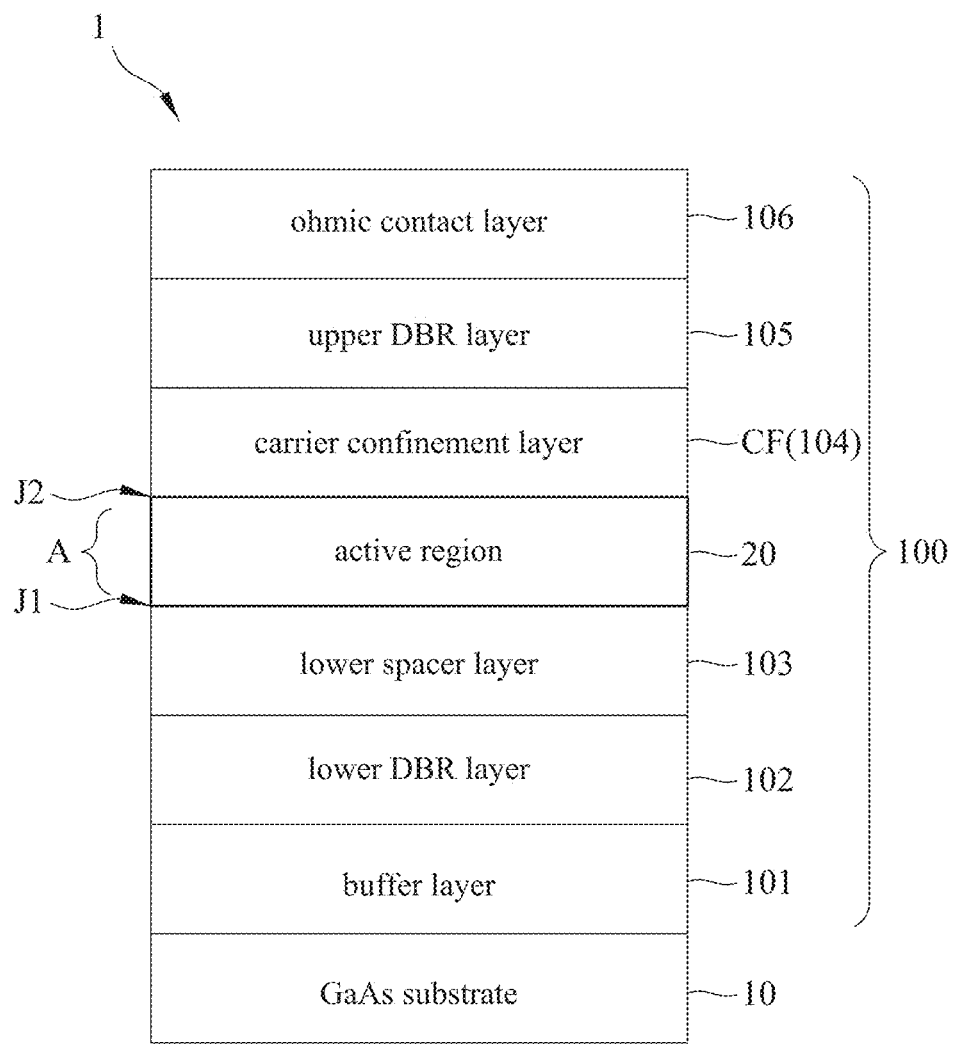
FIG. 12b shows a schematic diagram of an embodiment in which a carrier confinement layer is provided in the entire upper spacer layer.
Figure 12C:
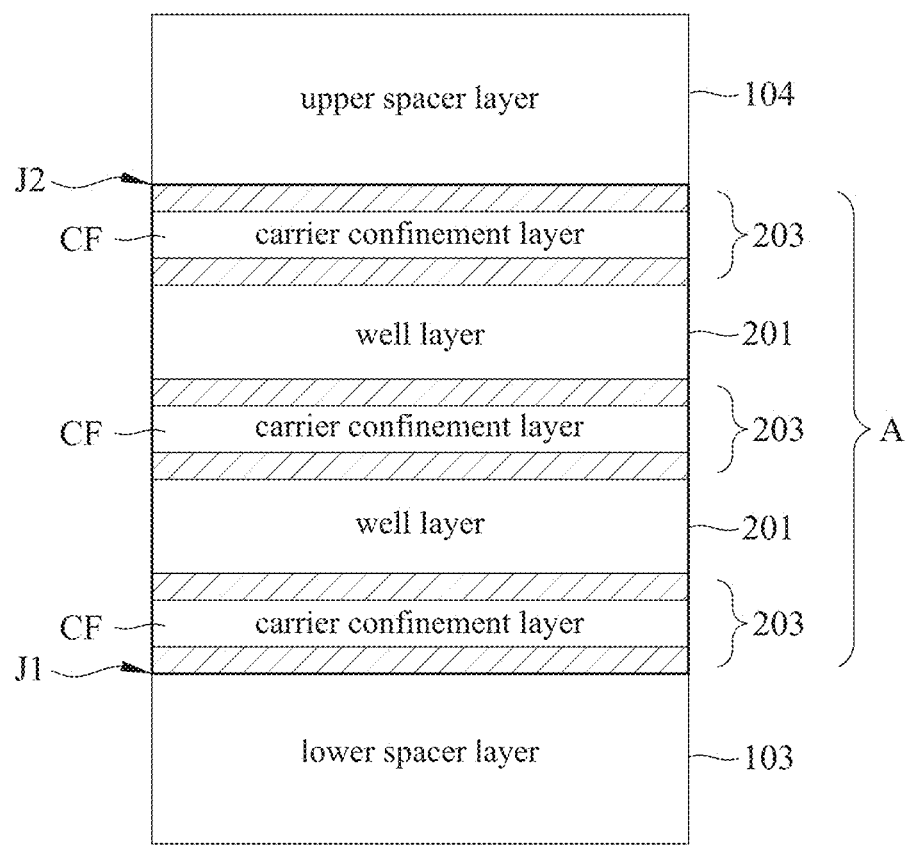
FIG. 12c is a schematic diagram showing that each barrier layer of the active layer is provided with a carrier confinement layer.

FIGS. 11a-11d are schematic diagrams of embodiments in principle, and please refer to FIGS. 12a-12c with respect to the embodiments specifically applied to VCSELs. FIG. 12a is a schematic diagram showing an embodiment in which a carrier confinement layer is provided in a part of a lower spacer layer, FIG. 12b shows a schematic diagram of an embodiment in which a carrier confinement layer is provided in the entire upper spacer layer, and FIG. 12c is a schematic diagram showing that each barrier layer of the active layer is provided with a carrier confinement layer.

Referring to FIG. 12a and in conjunction with FIG. 11d, the lower spacer layer 103 of FIG. 12a can be regarded as in the lower epitaxial region 30' of FIG. 11d. As shown in FIG. 12a, the carrier confinement layer CF is formed in a part of the lower spacer layer 103. The carrier confinement layer CF has an effective distance in which the carrier can be confined to the active layer from the first surface J1, such that the carrier confinement layer CF does not need to contact with the active layer In some embodiments, the entire upper spacer layer 104 forms a carrier confinement layer CF, as shown in FIG. 12b. Although FIG. 12c shows that the carrier confinement layer CF is disposed in a part of each barrier layer 203, but not limited thereto, the carrier confinement layer CF may be disposed in some entire barrier layers or all the entire barrier layers.

In summary, in Embodiment 9, the carrier confinement layer is formed near one surface of the active layer. When the material of the carrier confinement layer is at least one of the materials listed in Table 6, the conduction band offset or the valence band offset between the carrier confinement layer and the well layer becomes larger. As such, when holes or electrons are injected into the active layer, especially at a high temperature operation, electrons or holes in the active layer will be confined by the carrier confinement layer, and the better the carrier confinement capability is, the better the VCSEL's optical performance is.

Embodiment 10

In Embodiment 10, a carrier confinement layer CF is formed near one surface of the active layer. The material of the carrier confinement layer CF may be selected from at least one of the materials or a combination of at least two materials listed in Table 7 or Table 8. The materials in Table 7 have a larger barrier height to holes such that the effect on the confinement of holes is better. The materials in Table 8 have a larger barrier height to electrons such that the effect on the confinement of electrons is better.

TABLE 7

| AlGaInP | AlGaInPN | AlGaInPSb | AlGaInPBi |
|---|---|---|---|
| InGaAsP | InGaAsPN | InGaAsPSb | InGaAsPBi |
| InGaP | InGaPN | InGaPSb | InGaPBi |
| InAlGaAsP | | | |

TABLE 8

| AlGaAsP | AlGaAsPN | AlGaAsPSb | AlGaAsPBi |
| AlGaInP | AlGaInPN | AlGaInPSb | AlGaInPBi |
| InAlGaAsP | | | |

Taking FIG. 12a as an example, in the case that holes are injected into the active layer 20 through the upper DBR layer 105 and the second surface J2, when the material of the carrier confinement layer CF adjacent to the first surface J1 is any of the materials in Table 7, the carrier confinement layer CF has a large barrier height to holes. Therefore, when holes continue to move toward the GaAs substrate, holes will be confined by the carrier confinement layer CF, thereby improving the carrier holes confinement of the active layer. It is worth mentioning that, in the above case, when the material of the carrier confinement layer adjacent to the first surface J1 is InGaP or AlGaInP of Table 7, and the material of the epitaxial layer adjacent to the carrier confinement layer is AlGaAs or other suitable materials, the electron barrier height at the interface between InGaP and AlGaAs or between AlGaInP and AlGaAs is relatively small, or no electron barrier height therebetween. Therefore, electrons can be injected into the active layer without hindrance such that the resistance in the laser diode does not easily increase. In this case, the upper DBR layer 105 is mainly a P type, and the lower DBR layer 102 is mainly an N type.

Also taking FIG. 12a as an example, in the case that electrons are injected into the active layer 20 via the upper DBR layer 105 and the second surface J2, when the material of the carrier confinement layer CF adjacent to the first surface J1 is any of the materials in Table 8, the carrier confinement CF has a larger barrier to electrons. Accordingly, when electrons continue to move toward the GaAs substrate, electrons will be confined by the carrier confinement layer CF, thereby enhancing the electron confinement of the active layer. It is worth mentioning that, in the above case, when the material of the carrier confinement layer adjacent to the first surface J1 is AlGaAsP of Table 8, and the material of the epitaxial layer adjacent to the carrier confinement layer is AlGaAs or other suitable materials, the hole barrier height at the surface between AlGaAsP and AlGaAs is relatively small. Therefore, holes can be injected into the active layer without hindrance such that the resistance in the laser diode does not easily increase. In this case, the upper DBR layer 105 is mainly a N type, and the lower DBR layer 102 is mainly an P type.

Embodiment 11

Figure 13:
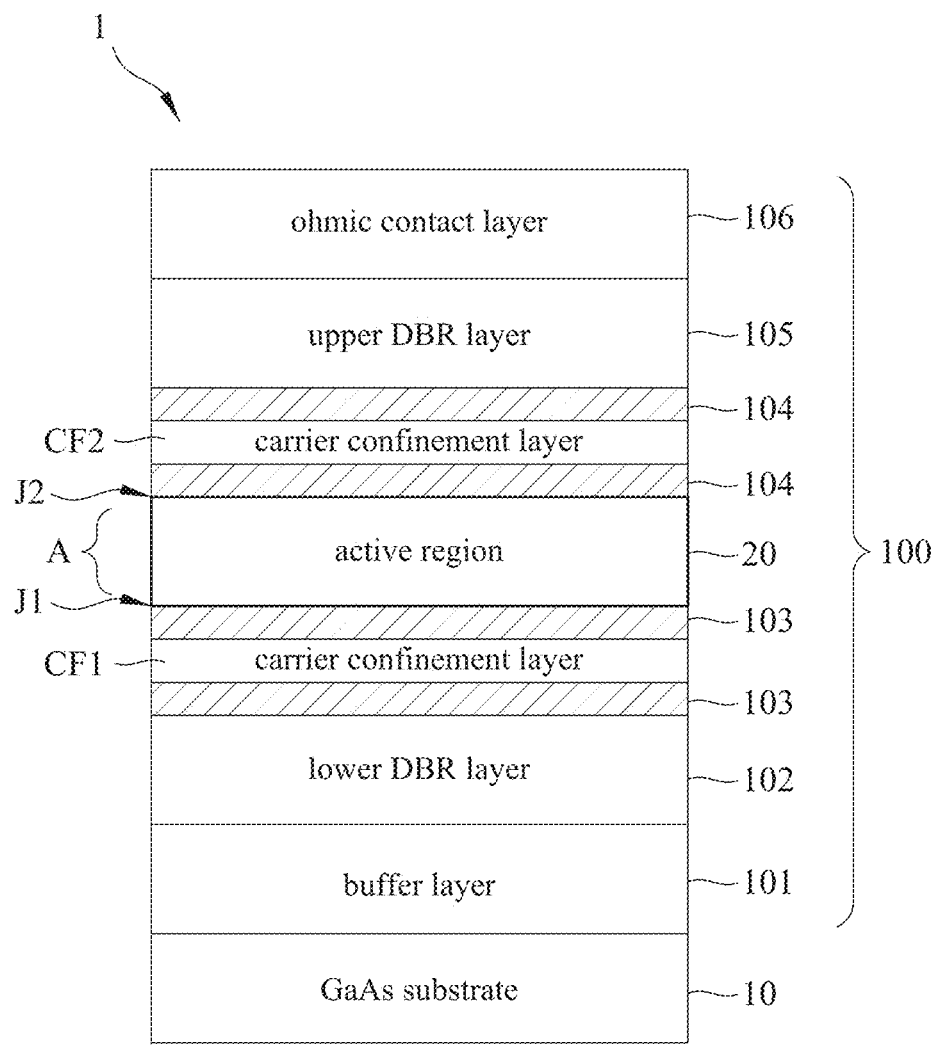
FIG. 13 is a schematic diagram of an embodiment showing that a carrier confinement layer is disposed both above and below the active layer.

As shown in FIG. 13, Embodiment 11 includes two carrier confinement layers CF1 and CF2. These two carrier confinement layers CF1 and CF2 are formed near the first surface J1 and the second surface J2 of the active layer 20, respectively. In the case that holes and electrons are injected into the active layer from the second surface J2 and the first surface J1, respectively, when the materials of the carrier confinement layer CF1 and the carrier confinement layer CF2 are selected from at least one of the materials in Table 7 and Table 8, both the barriers height of the carrier confinement layer CF1 to holes and the carrier confinement layer CF2 to electrons can be increased such that the confinements of the holes and electrons are enhanced, and the performance of the laser diode can be improved.

Similarly, in the case that holes and electrons are injected into the active layer from the first surface J1 and the second surface J2, respectively, when the materials of the carrier confinement layer CF1 and the carrier confinement CF2 are selected from at least one of the materials in Table 8 and Table 7, both the barriers height of the carrier confinement CF1 to electrons and the carrier confinement layer CF2 to holes can be increased such that the confinements of the holes and electrons are enhanced, and the performance of the laser diode can be improved.

In a preferred embodiment, when InGaP or AlGaInP is selected from Table 7, AlGaAsP is selected from Table 8, and the material of epitaxial layer adjacent to the carrier confinement layers CF1 and CF2 is AlGaAs or other suitable materials, not only the confinements of holes and electrons have been significantly enhanced, but also the holes and electrons can be injected into the active layer without hindrance.

When at least one of the materials listed in Table 6, Table 7 or Table 8 is selected as the material of the carrier confinement layer, and the carrier confinement layer is disposed in an appropriate position, the carrier confinement effect can be enhanced, especially under the high temperature operation. In this case, the barrier layer in the active layer can use a material that does not induce strain, or the first semiconductor layer can be disposed above, below or in the active layer to induce appropriate strain for stain compensation. Please refer to the related embodiments of the first semiconductor layer for specific implementation.

Embodiment 12

Figure 14A:
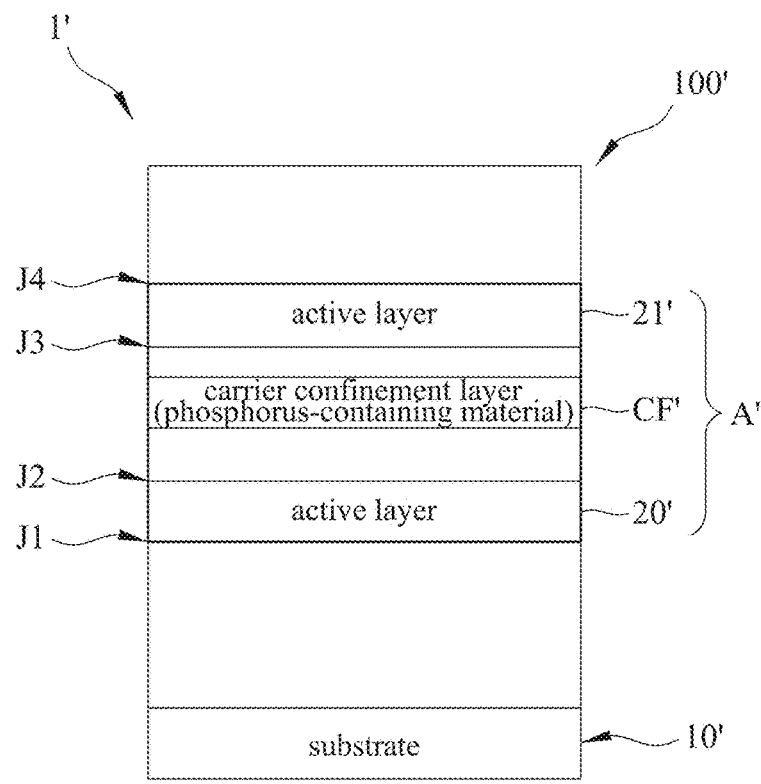
FIGS. 14a-14c are simplified schematic diagrams showing some representative embodiments in which the active region includes two active layers, and the confinement layer is disposed between these two active layer.
Figure 14B:
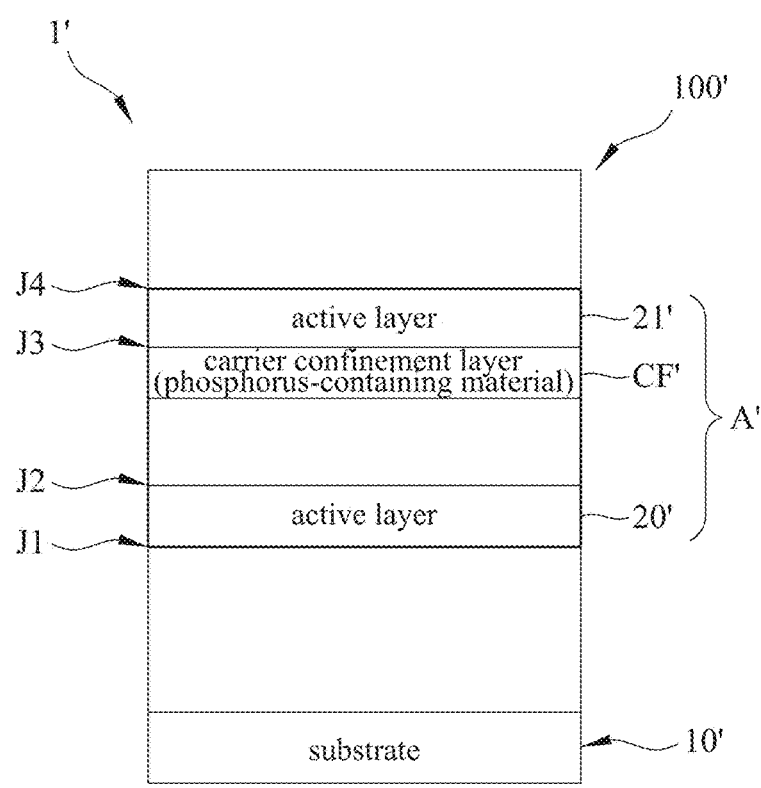
Figure 14C:
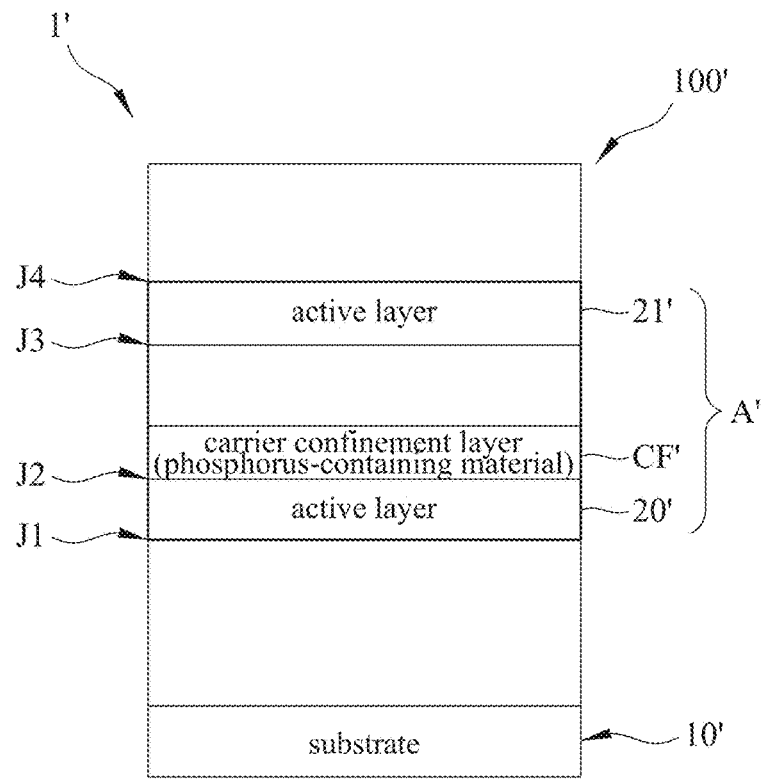

FIGS. 14a-14c are simplified schematic diagrams showing some representative embodiments in which the active region includes two active layers, and the confinement layer is disposed between these two active layer. As shown in FIG. 14a, the active regions A' includes two active layers 20' and 21'. When the carrier confinement layer CF' is disposed in the active region A', the carrier confinement layer CF' may be disposed between the second surface J2 and the third surface J3. The carrier confinement layer CF' may be separated from the second surface J2 or the third surface J3 by an effective distance that can confine the carriers to the active layer. In the case of multiple active layers with more than three active layers, one or two carrier confinement layers may be disposed between two adjacent active layers, or one or two carrier confinement layers may be disposed between any two adjacent active layers. In other embodiments, as shown in FIGS. 14b and 14c, the carrier confinement layer CF' may directly contact the second surface J2 or the third surface J3.

It must be explained again that FIGS. 14a, 14b and 14c show that the carrier confinement layer CF' is between two active layers 20' and 21', but not limited thereto. In an alternative embodiment, the carrier confinement layer CF' may be disposed in the active layer. In the case of FIG. 14a, the carrier confinement layer CF' is close to the second surface J2 or the third surface J3.

If there are more than three active layers, the carrier confinement layer may be formed between two adjacent active layers, or the carrier confinement layer may be provided in an active layer or some active layers. Alternatively, the above-mentioned methods may be applied to the active region with multiple active layers according to actual needs.

When the semiconductor laser diode is provided with one carrier confinement layer between two active layers, in principle, the material of the carrier confinement layer is at least one of the materials listed in Table 6.

Embodiment 13

Figure 14D:
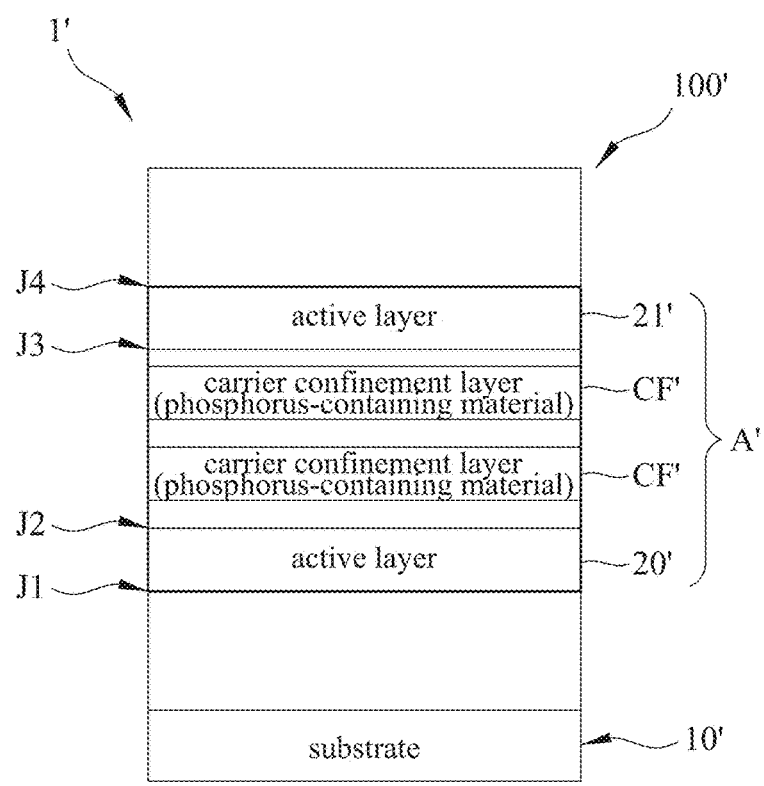
FIG. 14d is a simplified schematic diagram showing an embodiment in which two carrier confinement layers are disposed in the epitaxial region between the two active layers when the active region includes two active layers.
Figure 14E:
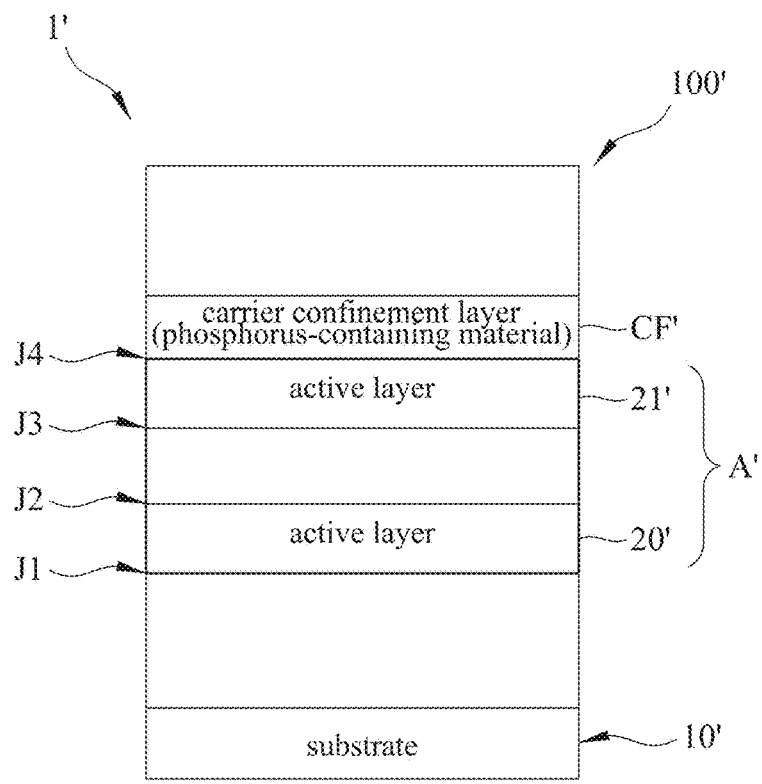
FIGS. 14e-14h are simplified schematic diagrams showing some representative embodiments in which the carrier confinement layer is disposed outside the active region when the active region includes two active layers.
Figure 14F:
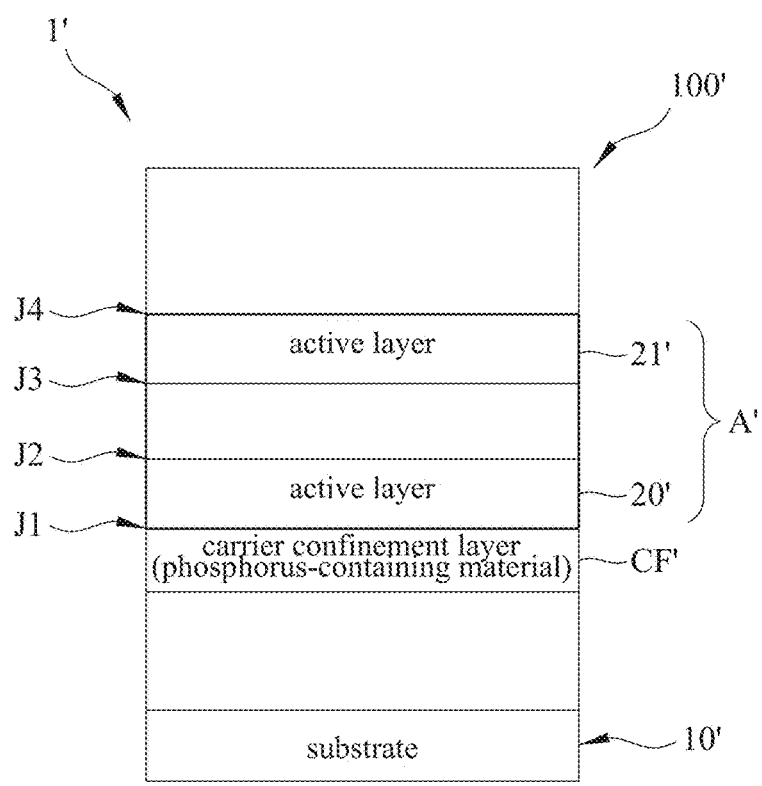
Figure 14G:
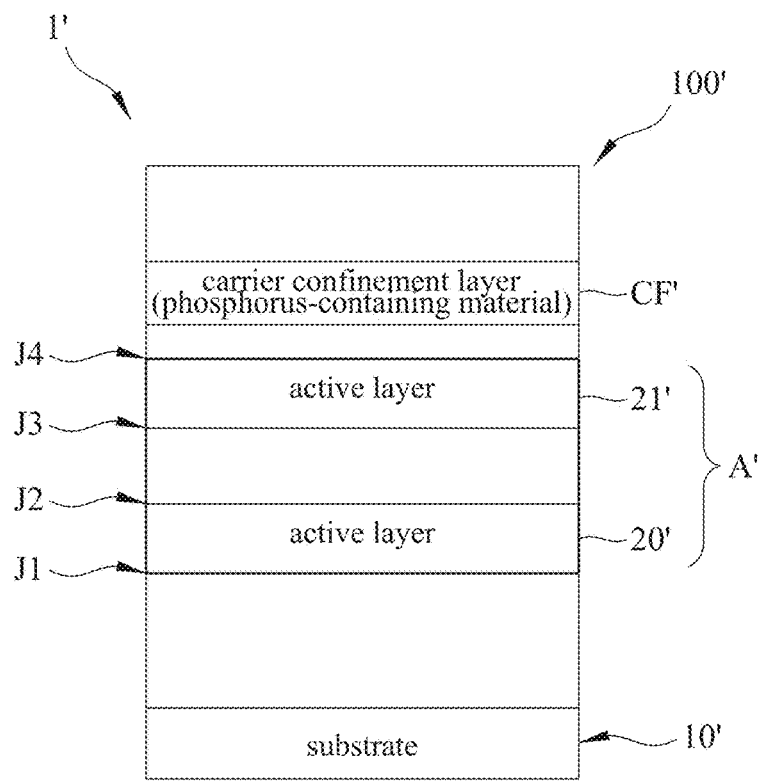
Figure 14H:
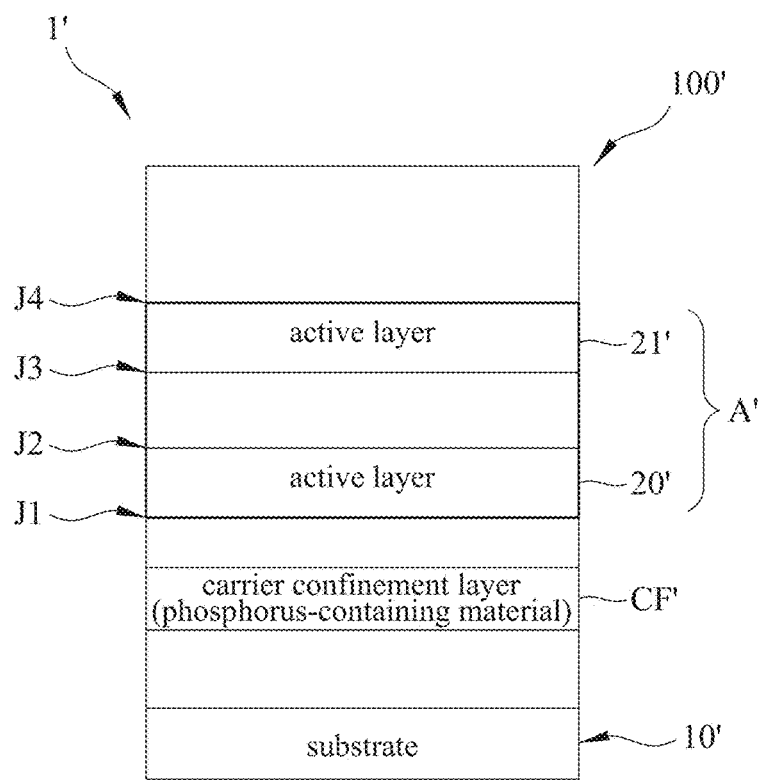

FIG. 14d is a simplified schematic diagram showing an embodiment in which two carrier confinement layers are disposed in the epitaxial region between the two active layers when the active region includes two active layers. In Embodiment 13, the material of one of two carrier confinement layers is at least one material selected from Table 7, and the material of another carrier confinement layer is at least one material selected from Table. 8

Embodiment 14

FIGS. 14e-14h are simplified schematic diagrams showing some representative embodiments in which the carrier confinement layer is disposed outside the active region when the active region includes two active layers. Embodiment 14 is based on Embodiment 9. Thus, please refer to the related examples of Embodiment 9 for the implementation of Embodiment 14. In addition, the carrier confinement layers may be provided above and below the active region A'. The material of one of two carrier confinement layers is at least one material selected from Table 7, and the material of another carrier confinement layer is at least one material selected from Table 8.

Embodiment 15

Figure 15:
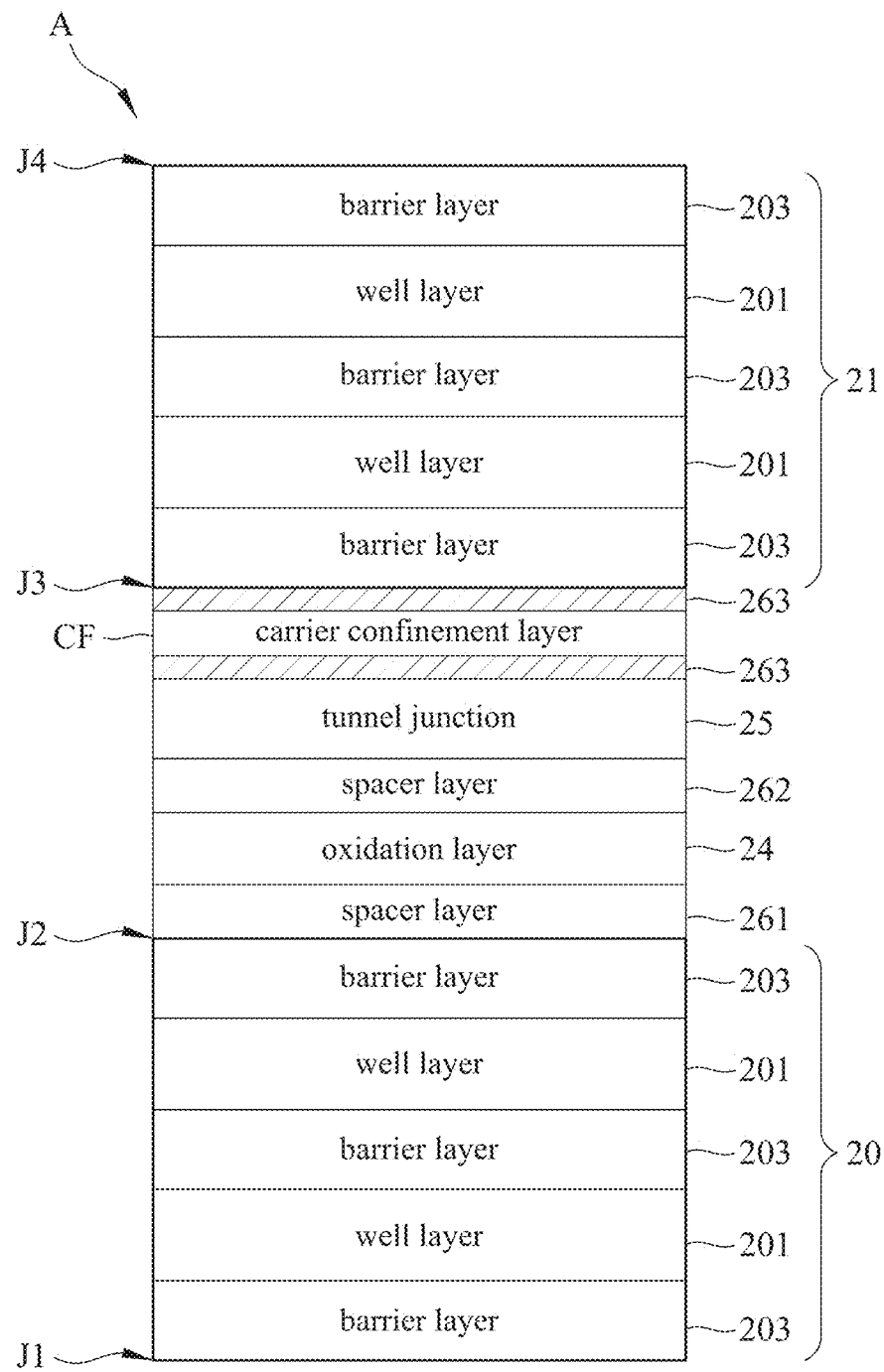
FIG. 15 shows a schematic diagram of a preferred embodiment in which a carrier confinement layer is disposed between two active layers.
Figure 16:
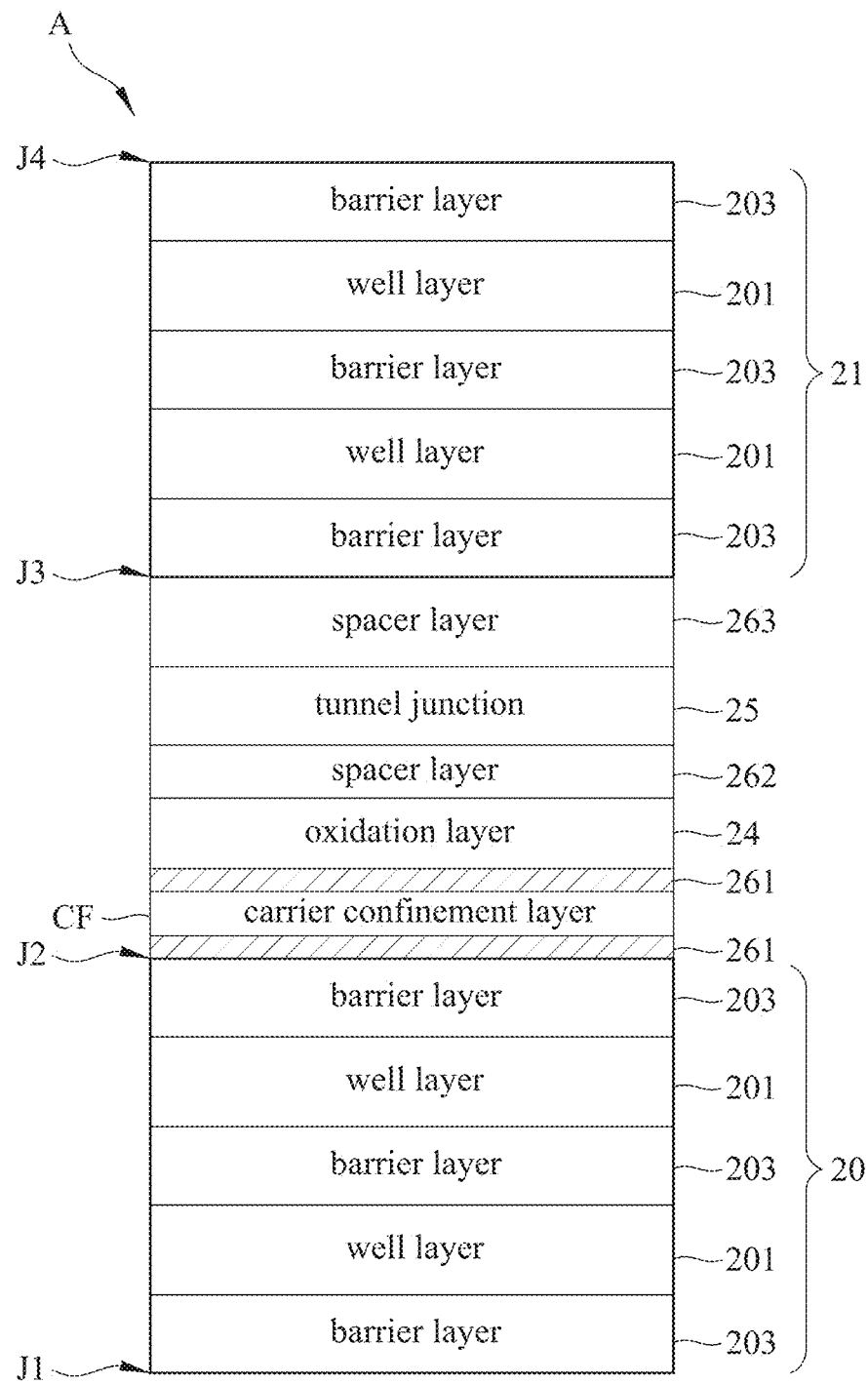
FIG. 16 shows a schematic diagram of another preferred embodiment in which a carrier confinement layer is disposed between two active layers.

FIG. 14a is a schematic diagram of a principle embodiment. Please refer to FIG. 15 for an embodiment specifically applied to a VCSEL. FIG. 15 shows a schematic diagram of a preferred embodiment in which a carrier confinement layer is disposed between two active layers. As shown in FIG. 15, the VCSEL includes two active layers 20 and 21, the epitaxial region is disposed between these two active layers, and is between the second surface J2 and the third surface J3. A preferred structure of the epitaxial region between two active layers 20 and 21 is shown in FIG. 9, which includes a tunnel junction, an oxidation layer and a spacer layer. The carrier confinement layer CF is disposed in a part of the spacer layer 263 such that the spacer layer 263 is also provided between the third surface J3 and the carrier confinement layer CF, but not limited thereto. For example, one surface of the carrier confinement layer CF may also be used as the surface in contact with the active layer 21. FIG. 16 shows that the carrier confinement layer CF may also be provided in the spacer layer 261 near the second surface J2, and the carrier confinement layer CF is disposed in the middle of the spacer layer 261.

Figure 17A:
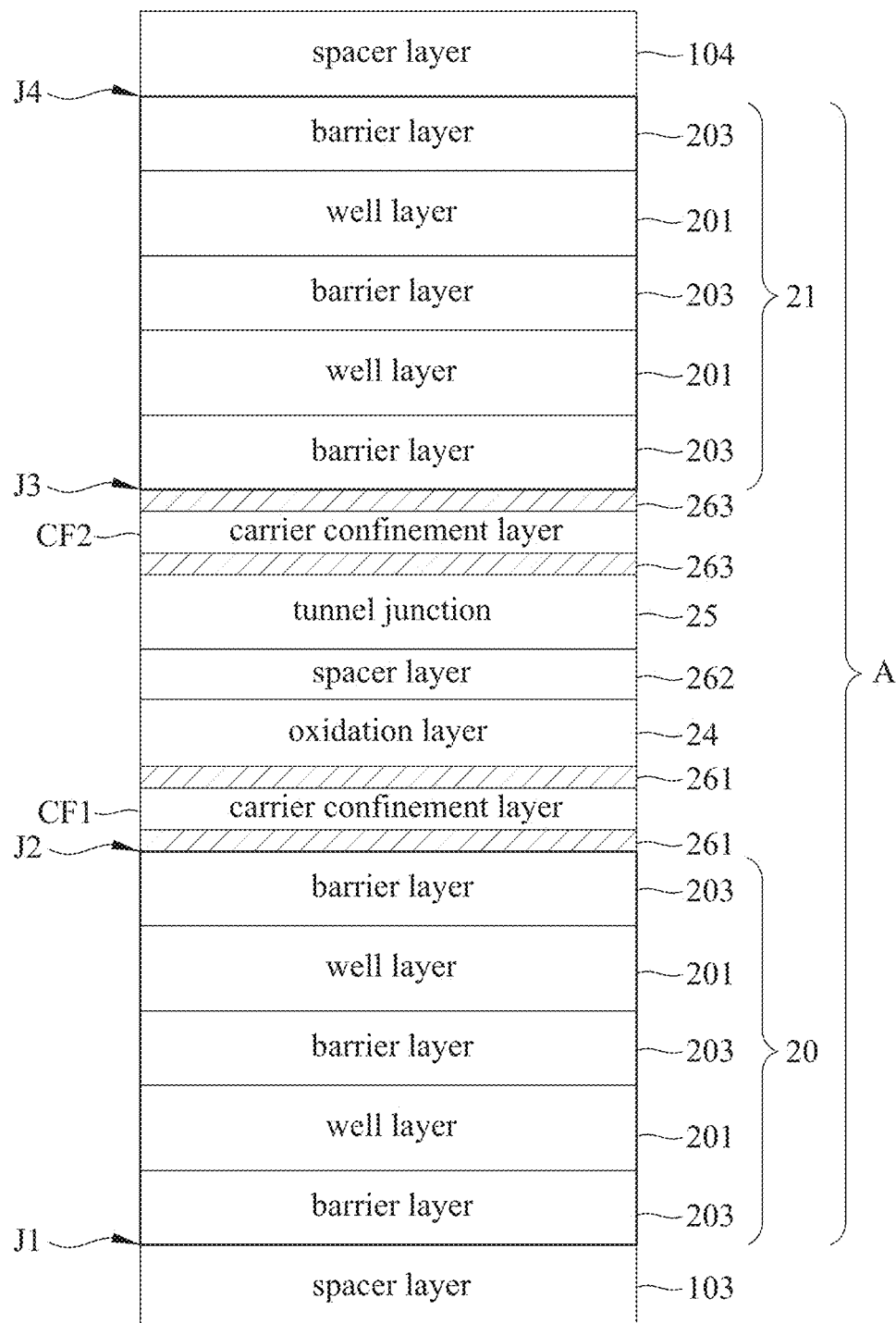
FIG. 17a shows a schematic diagram of an embodiment in which two carrier confinement layers are disposed between two active layers.
Figure 17B:
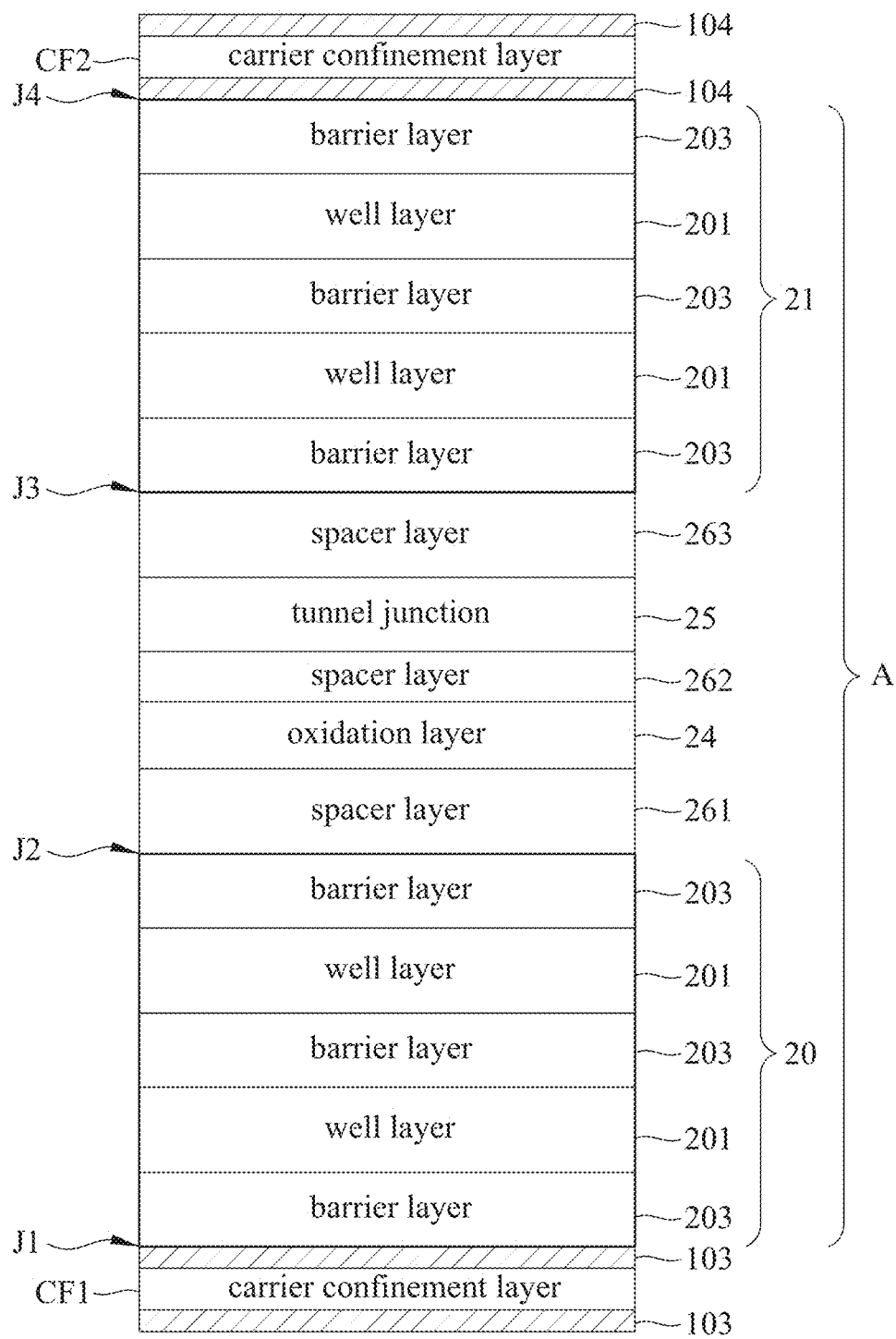
FIG. 17b shows a schematic diagram of an embodiment in which a carrier confinement layer is disposed both above and below the active region.

Please refer to FIG. 17a for another possible embodiment of FIG. 14d; that is, the carrier confinement layers CF1 and CF2 are provided between two active layers 20 and 21. Although FIG. 17a shows that the carrier confinement layers CF1 and CF2 are formed in the parts of the spacer layer 261 and the spacer layer 263, respectively, the carrier confinement layers CF1 and CF2 may be formed in the entire spacer layer 261 and the entire spacer layer 263, respectively. In an embodiment, as shown in FIG. 17b, the carrier confinement layers CF1 and CF2 are provided above and below the active region A. Although FIG. 17b shows that the carrier confinement layers CF1 and CF2 are formed in the parts of the lower spacer layer 103 and the upper spacer layer 104, respectively, the carrier confinement layers CF1 and CF2 may be formed in the entire lower spacer layer 103 and the entire upper spacer layer 104, respectively. In some embodiments, a carrier confinement layer(s) may also be formed above and/or below any active layer.

Figure 17C:
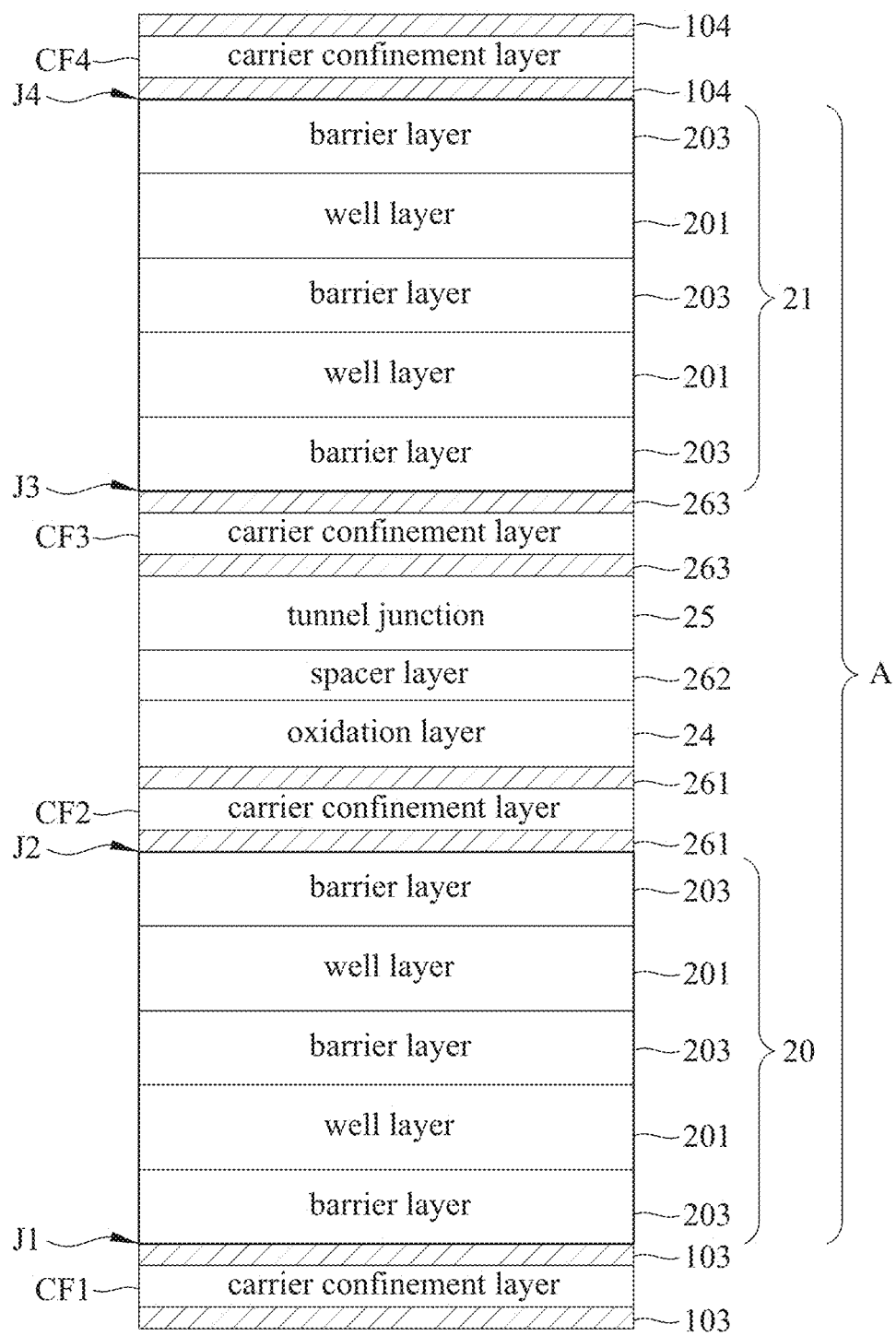
FIG. 17c show a schematic diagram of an embodiment in which a carrier confinement layer is disposed both above and below of each active region.

In some embodiments, as shown in FIG. 17c, the carrier confinement layers CF2 and CF3 are provided between two adjacent active layers 20 and 21, and the carrier confinement layers CF1 and CF4 are provided above and below the active region A. When holes are injected into the forth surface J4 through the upper spacer layer 104 and electrons are injected into the active layer 20 from the first surface J1, the materials of the carrier confinement layers CF1 and CF3 are at least one material selected from Table 7, and the materials of the carrier confinement layers CF2 and CF4 are at least one material selected from Table 8.

When electrons are injected into the fourth surface J4 through the upper spacer layer 104 and holes are injected into the active layer 20 from the first surface J1, the materials of the carrier confinement layers CF1 and CF3 are at least one material selected from Table 8, and the materials of the carrier confinement layers CF2 and CF4 are at least one material selected from Table 7.

Embodiment 16

Figure 18:
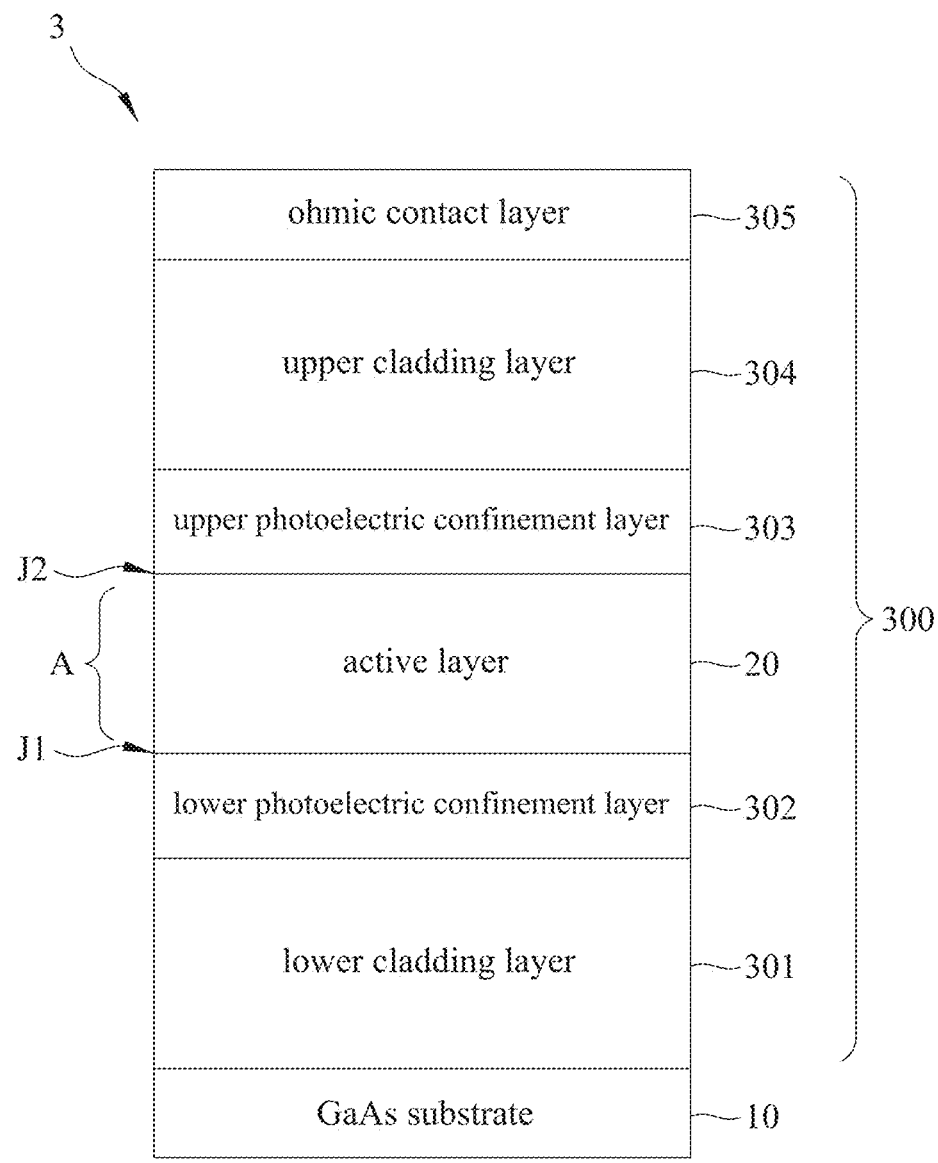
FIG. 18 is a schematic diagram showing a multi-layer structure of an existing EEL.
Figure 19A:
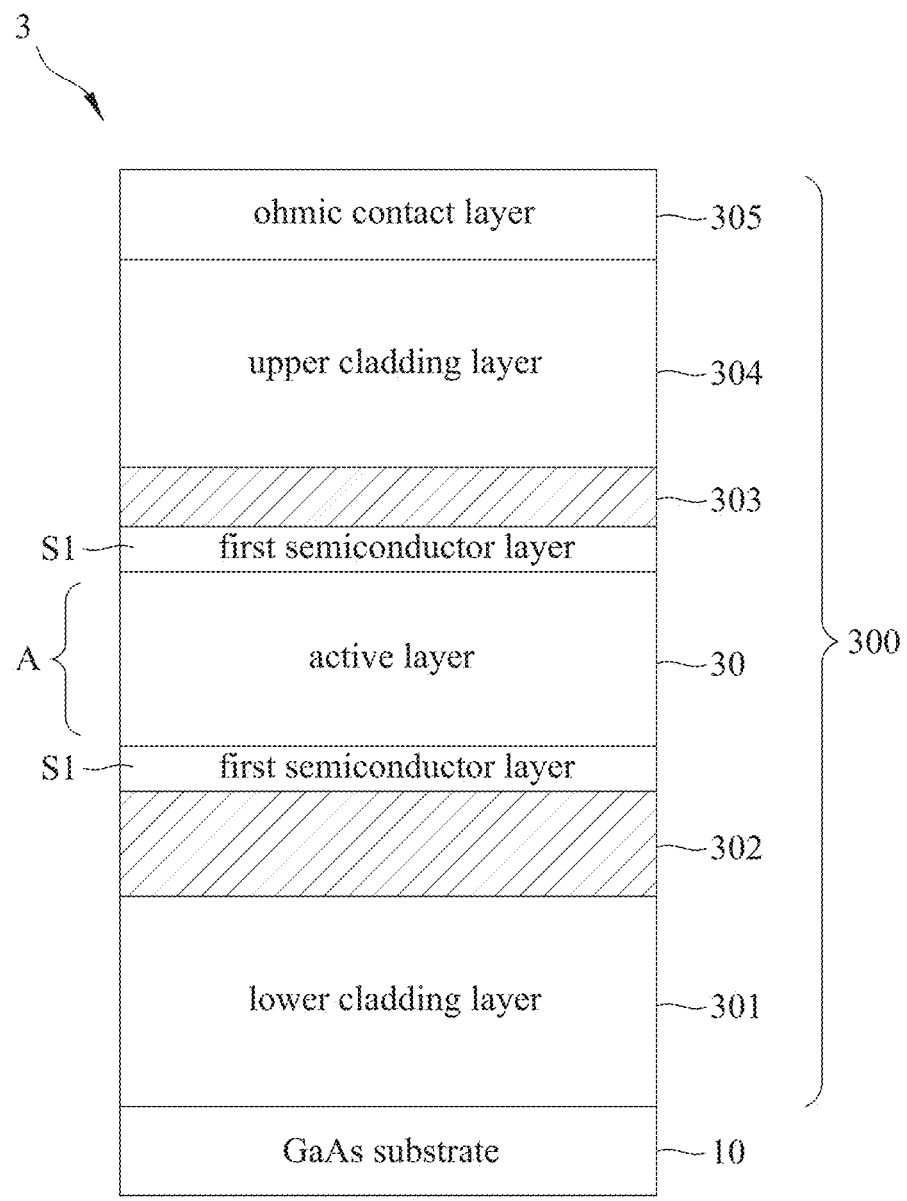
FIG. 19a shows a schematic diagram of an embodiment in which a first semiconductor layer is provided above and below an active layer of an EEL.
Figure 19B:
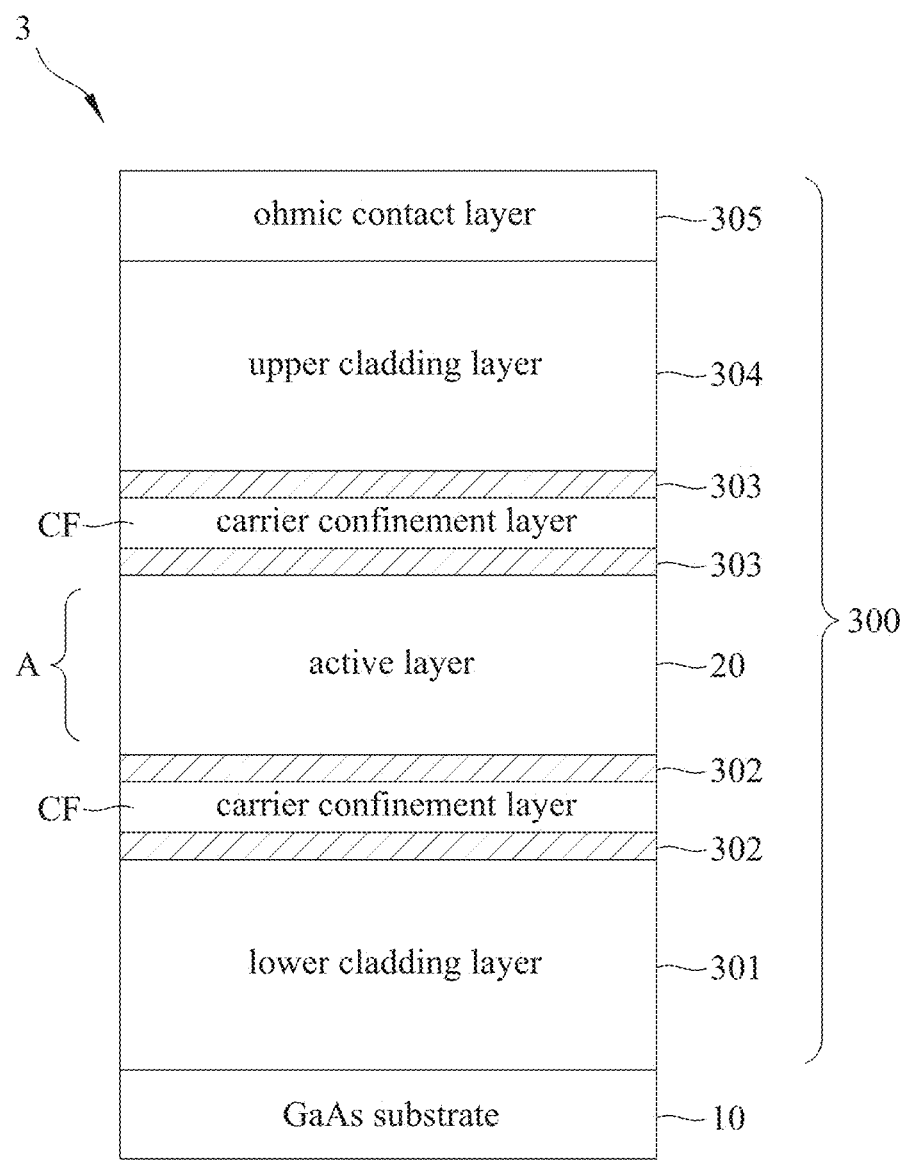
FIG. 19b is a schematic diagram illustrating an embodiment in which a carrier confinement layer is provided above and below the active layer of the EEL.

Referring to FIG. 18, FIG. 18 is a schematic diagram showing a multi-layer structure of an existing EEL. Referring to FIG. 19a, FIG. 19a shows a schematic diagram of an embodiment in which a first semiconductor layer is provided above and below an active layer of an EEL. Referring to FIG. 19b, FIG. 19b is a schematic diagram illustrating an embodiment in which a carrier confinement layer is provided above and below the active layer of the EEL. The semiconductor laser diode shown in FIG. 18 is an EEL 3. As shown in FIG. 18, the EEL 3 includes a GaAs substrate 10 and a multi-layer structure 300. The multi-layer structure 300 includes a lower cladding layer 301, a lower photoelectric confinement layer 302 (i.e., a lower separated confinement hetero structure), an active layer 20, an upper photoelectric confinement layer 303 (i.e., an upper separated confinement hetero structure), an upper cladding layer 304 and an ohmic contact layer 305. The active layer 20 is disposed between the lower photoelectric confinement layer 302 and the upper photoelectric confinement layer 303.

When the active layers of the EEL 3 and VCSEL 1 are quantum well structures, each embodiment of the first semiconductor layer implemented in the VCSEL 1 can also be directly implemented in the EEL 3 since the quantum well structures of the EEL 3 and VCSEL 1 are the same. For example, a part of or the entire of the barrier layer of the EEL 3 is provided with a first semiconductor layer, and the preferred materials for the well layers of the EEL 3 and VCSEL 1 are also the same. The disposing principles and exemplary embodiments of the first semiconductor layer are described in detail in Embodiment 1. Please refer thereto. Alternatively, a part of or the entire of the barrier layer of the EEL 3 is provided with a second semiconductor layer, and the preferred materials for the well layers and the intermediate layers of the EEL 3 are also the same as those of Embodiment 3. The disposing principles and exemplary embodiments of the second semiconductor layers are described in detail in Embodiment 3. Please refer thereto. Alternatively, an intermediate layer is further provided in the active layer of the EEL 3. The disposing principles and exemplary embodiments of the intermediate layer are described in detail in Embodiment 2. Please refer thereto. Alternatively, a first (or second) semiconductor layer is provided between two adjacent active layers of the EEL 3.

The disposing principles and exemplary embodiments of the first (second) semiconductor layer in the multi-active layer are described in detail in Embodiment 6. Alternatively, in the EEL with multiple active layers, in addition to providing a tunnel junction between two adjacent layers, a spacer layer may be further formed. The preferred embodiment of the epitaxial region between two active layers is described in detail in Embodiment 6. Please refer thereto. Some of Embodiments 1-6 may also be applied to the active layer of the EEL. Although Embodiments 1-6 are mainly for strain compensation, they may also have carrier confinement effects. Similar to the VCSEL, the lasing wavelength of the EEL is above 700 nm or above 800 nm.

If the strain compensation is the main consideration and the first semiconductor layer is disposed outside the active layer, in terms of the VCSEL, a first semiconductor layer is preferably provided in the lower spacer layer or the upper spacer layer of the VCSEL, or the lower spacer layer and the upper spacer layer are provided with a first semiconductor layer; in terms of the EEL, a first semiconductor layer is preferably provided in the lower photoelectric confinement layer or the upper photoelectric confinement layer, or the lower photoelectric confinement layer and the upper photoelectric confinement layer are provided with a first semiconductor as shown in FIG. 19a. The first semiconductor layer may directly or indirectly contact the active layer. According to the type of strain and the strain compensation, the preferred material of the first semiconductor layer may be one of the materials selected from Table 1 or Table 4, when the selected material of the first semiconductor layer has the large bandgap and the first semiconductor layer is at the appropriate position, there may also have obvious carrier confinement effects.

If the carrier confinement is the main consideration and the carrier confinement is disposed outside the active layer, in terms of the VCSEL, a carrier confinement layer is preferably provided in the lower spacer layer or the upper spacer layer of the VCSEL, or the lower spacer and the upper spacer layer are provided with a carrier confinement layer; in terms of the EEL, a carrier confinement layer is preferably provided in the lower photoelectric confinement layer or the upper photoelectric confinement layer, or the lower photoelectric confinement layer and the upper photoelectric confinement layer are provided with a carrier confinement layer as shown in FIG. 19b. The carrier confinement layer may directly or indirectly contact the active layer. The preferred material of the carrier confinement layer may be one of the materials selected from Table 6. If the lattice constant of the selected material can be adjusted, the selected material may even provide appropriate strain to the active layer or the epitaxial layer of the VCSEL for strain compensation. Alternatively, in an EEL with multiple active layers, one or two carrier confinement layers may be provided outside the active regain, between two active layers or between any two adjacent active layers. Please refer to Embodiments 11-15 for specific implementation.

In some embodiments, if the thickness of the lower photoelectric confinement layer or the upper photoelectric confinement layer is thin enough, the carrier confinement layer may also be disposed in the lower cladding layer or the upper cladding layer.

In some embodiments, as shown in FIG. 19b, the EEL includes two carrier confinement layers CF1 and CF2. A part of the lower photoelectric confinement layer 302 is provided with the carrier confinement layer CF1, and a part of the upper photoelectric confinement layer 303 is provided with the carrier confinement layer CF2. Although two carrier confinement layers are shown in FIG. 19b, a carrier confinement may be provided in a part of the lower photoelectric confinement layer, a part of the upper photoelectric confinement layer, the entire lower photoelectric confinement layer or the entire upper photoelectric confinement layer. The carrier confinement layer may also directly contact the active layer.

Embodiment 17

In addition to the quantum well structures, the active regions of the VCSEL and EEL also have quantum dot structures (not shown). An embodiment of a quantum dot structure mainly includes a quantum dot, a wetting layer and a cap layer. In the quantum dot structure, the preferred material of the quantum dot or wetting layer is InGaAs, InAlGaAs, GaAsSb, GaAs, AlGaAs, AlGaAsSb, GaAsP, InGaAsP or any combination of the above materials.

In terms of the VCSEL, in some embodiments, a spacer layer is provided above or below the quantum dot structure of the VCSEL, and in the embodiments of multiple quantum dot structures, a spacer layer may also be provided between two quantum dot structures. The first semiconductor layer (i.e., one of the 17 materials in Table 1) or the carrier confinement layer (i.e., one of the 17 materials in Table 6) may be formed in the cap layer, the spacer layer or both the cap layer and the spacer layer. A part of the cap layer or the spacer layer, the parts of the cap layer and the spacer layer, or the entire cap layer and the entire spacer layer may be provided with the first semiconductor layer or the carrier confinement layer.

In some embodiments, a spacer layer is provided both above and below the quantum dot structure of the VCSEL.

In terms of the EEL, in some embodiments, a lower photoelectric confinement layer is provided below the quantum dot structure of the EEL, or an upper photoelectric confinement layer is provided above the quantum dot structure of the EEL. In the embodiments of multiple quantum dot structures, a lower photoelectric confinement layer and/or an upper photoelectric confinement layer are provided between two quantum dot structures. A part of the cap layer, the lower photoelectric confinement layer or the upper photoelectric confinement layer, the entire cap layer, the entire lower photoelectric confinement layer or the entire upper photoelectric confinement layer may be provided with the first semiconductor layer or the carrier confinement layer.

In some embodiments, the lower photoelectric confinement layer and the upper photoelectric confinement layer are provided above and below the quantum dot structure of the EEL. Alternatively, the cap layer, the lower photoelectric confinement layer and the upper photoelectric confinement layer are all provided with the first semiconductor layer or the carrier confinement layer.

Embodiment 18

For a semiconductor laser diode such as a VCSEL or an EEL, the substrate material thereof may also be InP. Compared to a GaAs substrate, when a substrate of a semiconductor laser diode is an InP substrate, there are many choices for the material of each epitaxial layer on the substrate. For example, the material of the well layer and the barrier may be an aluminum-containing material or a non-aluminum-containing material, but the bandgaps of materials suitable for the epitaxial layer are relatively small such that it is necessary to further improve the high-temperature.

For example, in the active layer (region), a carrier confinement layer may be provided in a barrier layer, some barrier layers or each barrier layer of the active layer, or one or more carrier confinement layers may also be provided in the upper epitaxial region and/or the lower epitaxial region. The disposing principles and preferred embodiments of the carrier confinement layer are described in Embodiments 11-15. Please refer thereto. It is important to note that since the material of the substrate is InP, the preferred materials for the carrier confinement layer may be InGaP, InAlGaP, InP, InAlAsP, AlAsSb, AlAsBi, AlGaAsSb, AlGaAsBi, AlPSb, AlPBi, InGaAsP or any combination of the above materials. The PL peak wavelength of InGaAsP does not exceed 900 nm.

InGaP, InAlGaP, InP and InGaAsP in the above materials have a good holes confinement effect; InAlAsP, AlAsSb, AlAsBi, AlGaAsSb, AlGaAsBi, AlPSb, AlPBi have a good electrons confinement effect.

The distance between the carrier confinement layer and the active layer usually does not exceed 120 nm, and the thickness of the carrier confinement layer is greater than 2 nm.

Embodiments 19 and 20 as Well as Comparative Embodiment 1

In the present disclosure, the defect or dislocation in the epitaxial layer of the VCSEL is presented by X-ray topography (XRT) in Comparative Embodiment 1 and Embodiments 19 and 20 to show the improvement of the dislocation. In Comparative Embodiment 1 and Embodiments 19 and 20, XRT imaging is performed on the wafer center of the VCSEL epitaxial wafer.

For the materials and thicknesses of the active layers, please refer to Table 9 to compare the embodiments of the present disclosure with the prior art (Comparative Embodiment 1). In Comparative Embodiment 1, there are an InGaAs well layer and a 6 nm AlGaAs barrier layer. In Embodiment 19, a 4 nm AlGaAs intermediate layer is provided in a GaAsP barrier layer with a thickness of 2 nm; that is, the thicknesses of two GaAsP barrier layers on both sides of the AlGaAs intermediate layer and adjacent to the well layer are 2 nm in total (the thickness of each GaAsP barrier layer is 1 nm). The Al contents of AlGaAs and AlGaAsP in Comparative Embodiment 1 and Embodiments 19 and 20 are 20%.

TABLE 9

|  | well layer | intermediate layer | barrier layer |
|---|---|---|---|
| Comparative Embodiment 1 | InGaAs 7 nm | n/a | AlGaAs 6 nm |
| Embodiment 19 | InGaAs 7 nm | AlGaAs 4 nm | GaAsP 2 nm |
| Embodiment 20 | InGaAs 7 nm | n/a | AlGaAsP 6 nm |

Figure 20A:
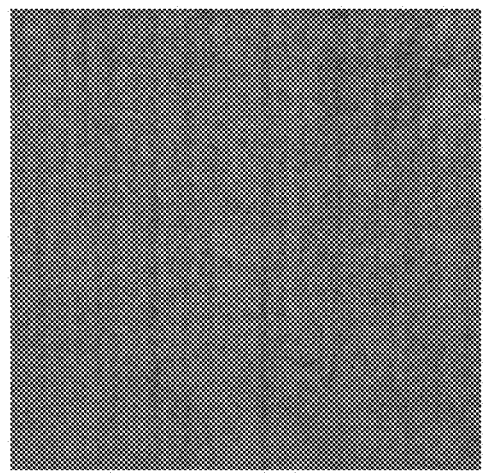
FIG. 20a shows a schematic XRT image of Comparative Embodiment 1.
Figure 20B:
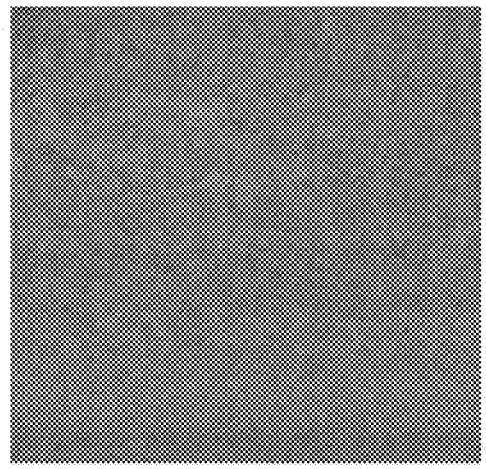
FIG. 20b shows a schematic XRT image of Embodiment 20.
Figure 20C:
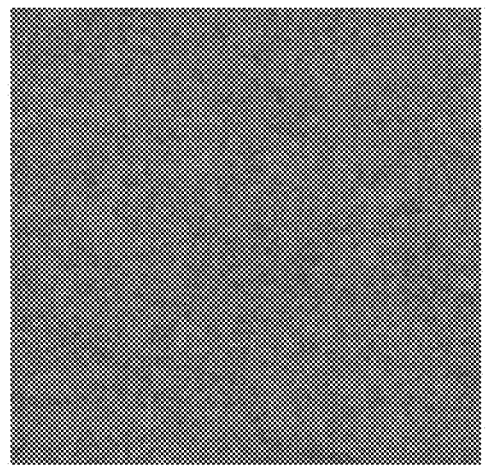
FIG. 20c shows a schematic XRT image of Embodiment 21.

FIGS. 20a-20c show XRT images according to Comparative Embodiment 1 and Embodiments 19 and 20 of the present disclosure. FIG. 20a is an XRT image of Comparative Embodiment 1, and FIGS. 20b and 20c are XRT images of Embodiments 19 and 20, respectively. By the XRT image of Comparative Embodiment 1, it can be observed that there are many obvious dark lines in Comparative Embodiment 1, that is, obvious dislocations. In contrast, according to the XRT image of Embodiment 19, although some dark lines may appear faintly in Embodiment 19, they are not obvious relative to Comparative Embodiment 1 while according to the XRT image of Embodiment 20, the dark lines (dislocations) are hardly observed in Embodiment 20. As such, compared with Comparative Embodiment 1, Embodiments 19 and 20 can reduce the dislocations in the epitaxial layer of the VCSEL.

In Comparative Embodiment 1, InGaAs and AlGaAs are used as the materials of the well layer and the barrier layer. When the material of the substrate is GaAs, both InGaAs and AlGaAs will have compressive strain. Excessive compressive strain leads to more dislocations or defects in the epitaxial layer of the VCSEL, as shown by the multiple dark lines clearly visible in the XRT image of FIG. 20a. In Embodiment 19, by using a phosphorus-containing material such as GaAsP as the material of the barrier layer and AlGaAs as the material of the intermediate layer, the tensile strain is provided in the barrier layer to reduce the total strain of the active layers, thereby reducing the dislocations or defects of the epitaxial layer of the VCSEL and enhancing the ability of carrier confinement. In Embodiment 20, a phosphorus-containing material such as AlGaAsP is used as the material of the barrier layer, and the tensile strain is provided in the barrier layer. Therefore, compared to Comparative Embodiment 1, the defects or dislocations of the epitaxial layer of the VCSEL can be reduced.

The XRT images of Embodiments 19 and 20 demonstrate that the use of a phosphorus-containing material (one of the 17 materials in Table 1) in a semiconductor laser diode can effectively reduce the dislocations or defects of the laser diode.

Embodiments 21 and 22 as Well as Comparative Embodiment 2

Figure 21:
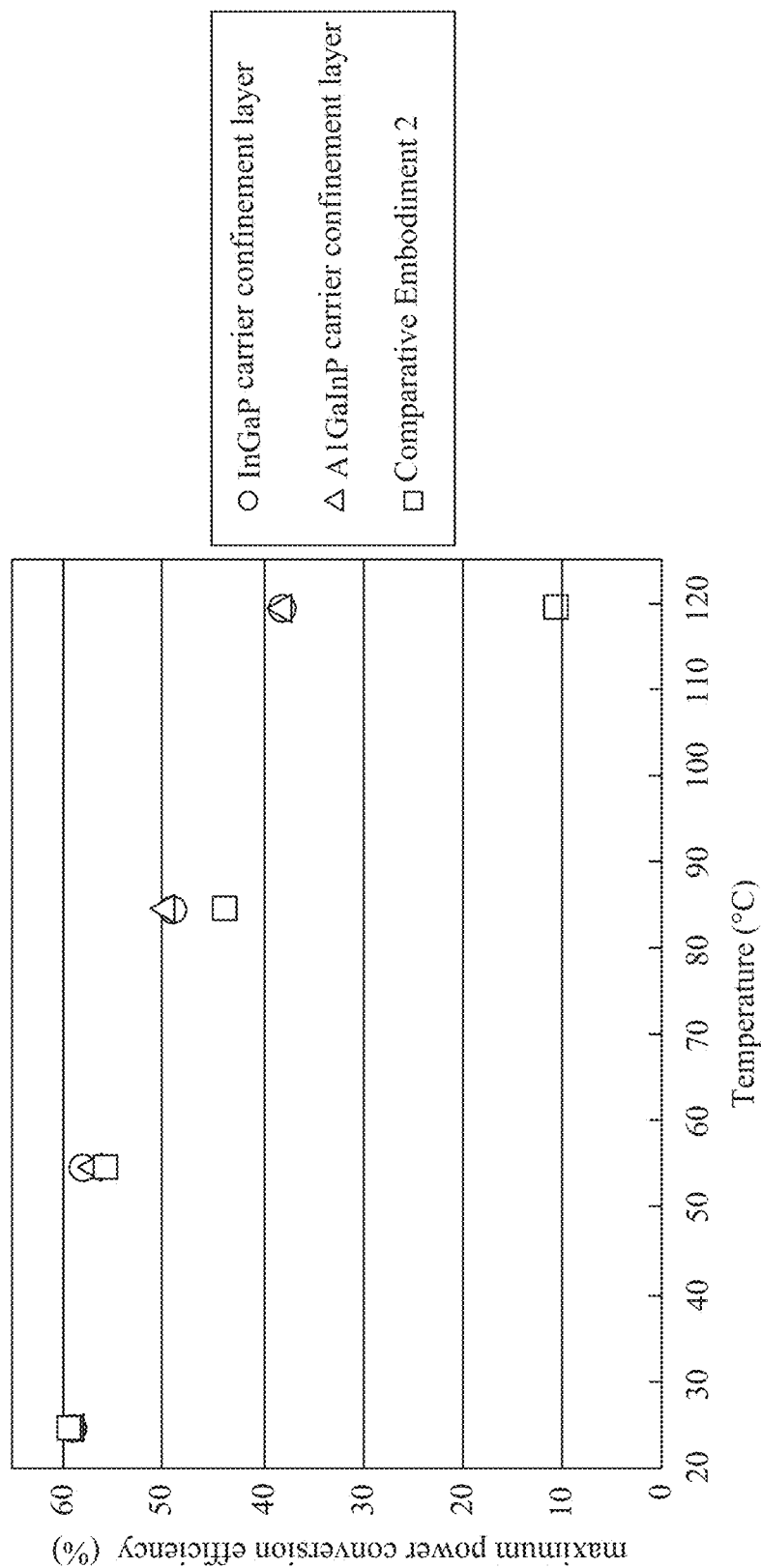
FIG. 21 is a comparison diagram of the maximum power conversion efficiency (PCE MAX) of Embodiments 21 and 22 as well as Comparative Embodiment 2 at different temperatures.

FIG. 21 is a comparison diagram of the maximum power conversion efficiency (PCE MAX) of Embodiments 21 and 22 as well as Comparative Embodiment 2 at different temperatures. Comparative Embodiment 2 is a VCSEL with no carrier confinement layer for the holes between two active layers. In the VCSEL of Embodiment 21, an n type AlGaInP carrier confinement layer for the holes is provided between two active layers, and in the VCSEL of Embodiment 22, an n type InGaP carrier confinement layer for the holes is provided between two active layers. Please refer to FIG. 15 for the location of the carrier confinement layer. According to Embodiment 21 and 22, the holes is injected into the active layer 21 from the fourth surface J4, the electrons is injected into the active layer 20 from the first surface J1. As shown in FIG. 21, at room temperature, Comparative Embodiment 2 is not significantly different from Embodiments 21 and 22 in the maximum power conversion efficiency. However, at high temperatures, compared to Comparative Embodiment 2, the maximum power conversion efficiency of embodiments 21 and 22 is significantly improved, and the higher the temperature increases, the more maximum power conversion efficiency of the embodiment 21 and 22 is increased.

Embodiment 23 and Comparative Embodiment 3

Figure 22:
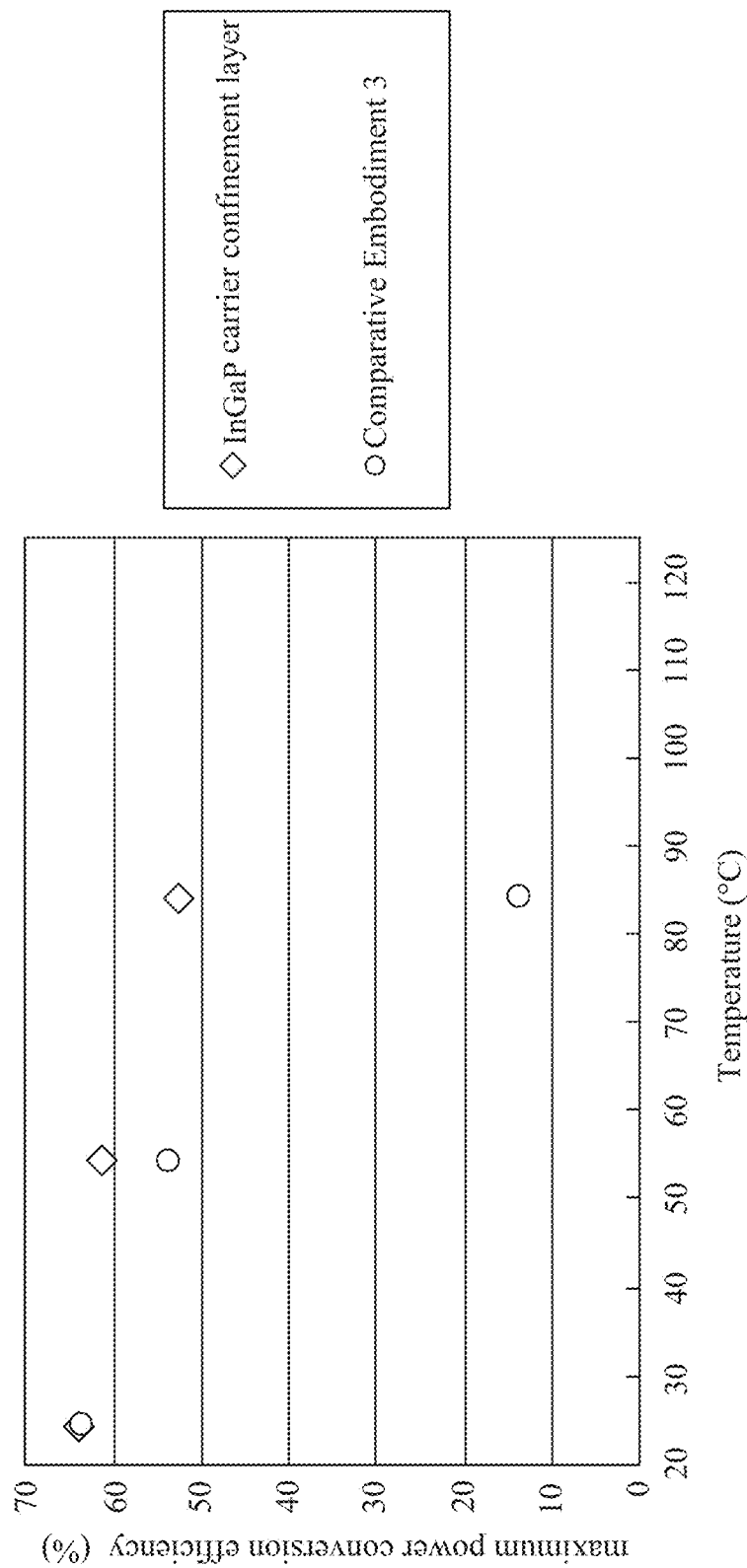
FIG. 22 is a comparison diagram of the maximum power conversion efficiency of Embodiment 23 and Comparative Embodiment 3 at different temperatures.

FIG. 22 is a comparison diagram of the maximum power conversion efficiency of Embodiment 23 and Comparative Embodiment 3 at different temperatures. The VCSEL of Comparative Embodiment 3 includes five active layers and does not have a carrier confinement layer for the holes while the VCSEL of Embodiment 23 also includes five active layers and has an n type InGaP carrier confinement layer for the holes between each two adjacent active layers, Please refer to FIG. 15 for the location of the carrier confinement layer between each two adjacent active layers. According to Embodiment 23, the holes are injected into the active layer 21 from the fourth surface J4, the electrons are injected into the active layer 20 from the first surface J1. As shown in FIG. 22, at room temperature, there is no significant difference between Comparative Embodiment 3 and Embodiment 23 in the maximum power conversion efficiency. However, at high temperatures, compared to the comparative embodiment 3, the maximum power conversion efficiency of embodiments 23 is significantly improved, the higher the temperature increases, the more the maximum power conversion efficiency of the embodiment 23 is increased.

It can be seen from the above that a carrier confinement layer(s) for the holes disposed in two, three, four or more active layers has/have the effect of improving high-temperature performance of multi-junction VCSEL. In general, compared to electrons, holes are less active due to their greater effective mass. In the case where the VCSEL has only one active layer, the optical output power density of the VCSEL is relatively small such that the temperature of the active region or junction temperature is also relatively low. Therefore, the holes are relatively easily confined to the active layer. However, under the same operating current, since the optical output power density of the VCSEL with multiple active layers will increase significantly, the temperature of the active region or junction temperature will also increase significantly, and the holes will become more active. Consequently, the holes must be confined to maintain or further improve the optical performance of the VCSEL. In addition, the VCSEL with multiple active layers achieves high optical output power or high power conversion efficiency through the carrier recycling mechanism (the VCSEL with a single active layer does not have the carrier recycling mechanism). When the ability to confine holes between two active layers is not good, the carrier recycling effect will be poor, and the performance of the VCSEL with multiple active layers are also likely to deteriorate at high temperatures. In Embodiment 22 and Embodiment 23, since the InGaP carrier confinement layer for confining holes is provided, the maximum power conversion efficiency of the VCSEL with two active layers and the VCSEL with five active layers is significantly improved at high temperatures. Similarly, in Embodiment 21, the AlInGaP carrier confinement layer for confining hole is also provided. Therefore, at high temperatures, the maximum power conversion efficiency of the VCSEL with two active layers is also significantly improved.

Embodiment 24 and Comparative Embodiment 4

Figure 23:
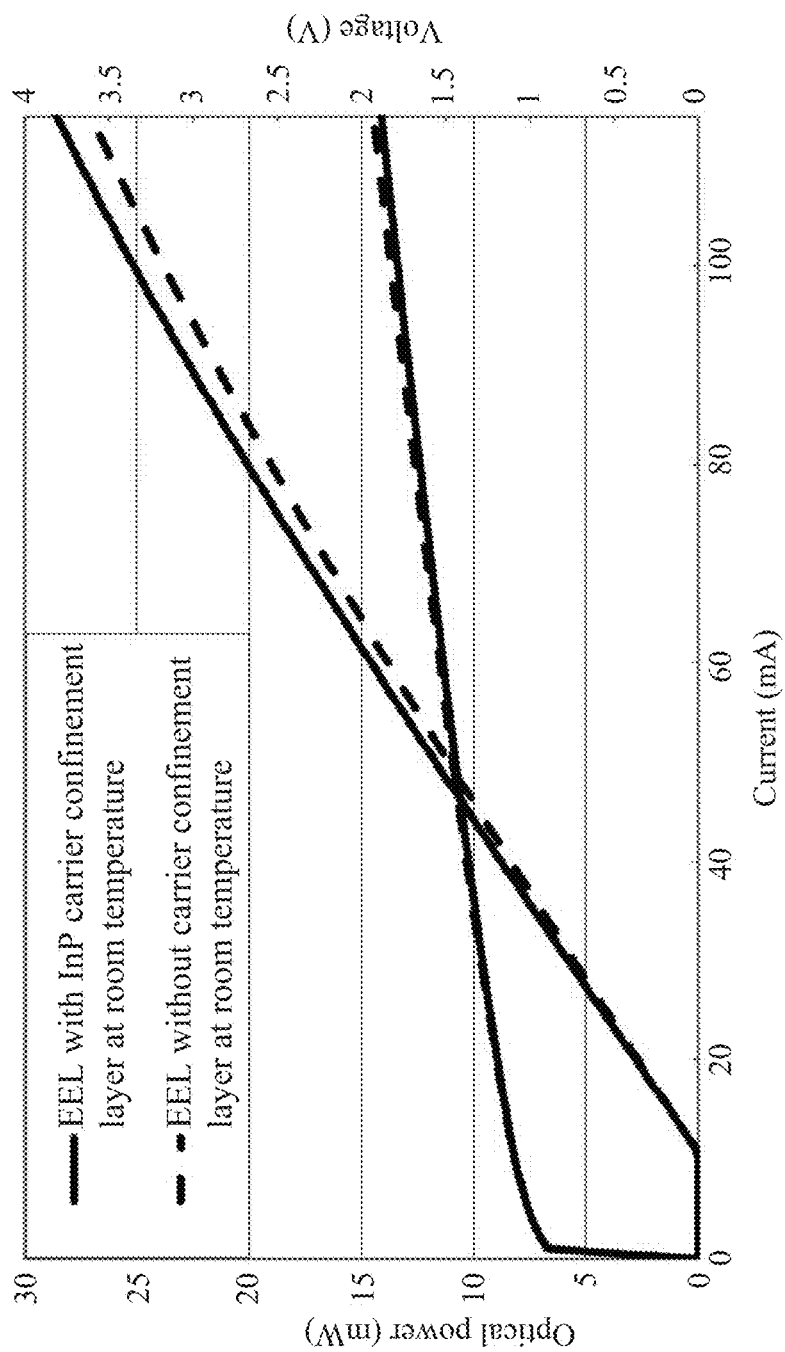
FIG. 23 is a L-I-V curve of Embodiment 24 and Comparative Embodiment 4 measured at room temperature.
Figure 24:
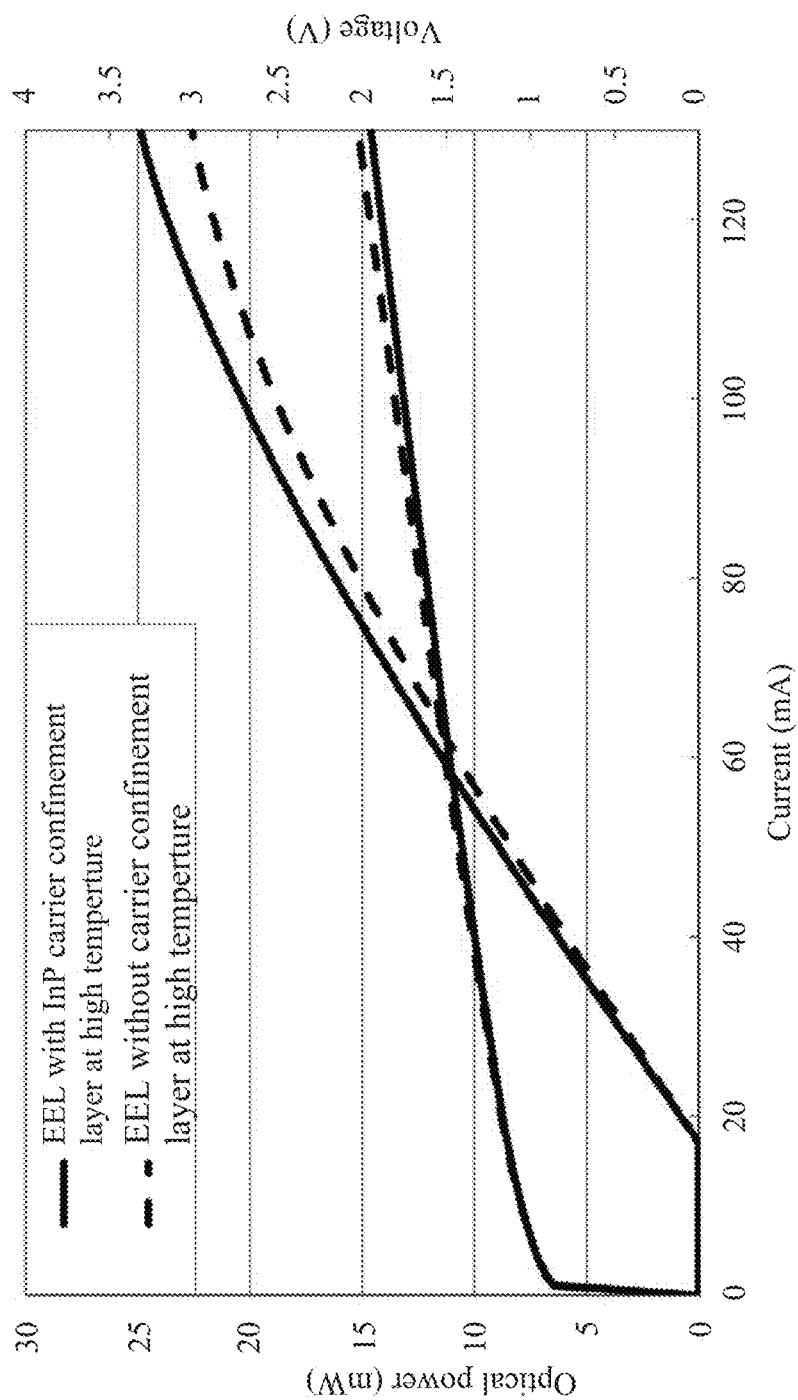
FIG. 24 is a L-I-V curve of Embodiment 24 and Comparative Embodiment 4 measured at high temperature.

FIG. 23 is a LIV curve of Embodiment 24 and Comparative Embodiment 4 measured at room temperature. FIG. 24 is a LIV curve of Embodiment 24 and Comparative Embodiment 4 measured at high temperature. The room temperature is about 25° C., and the high temperature is about 65° C. Embodiment 24 is an EEL with a carrier confinement layer for the holes, while Comparative Embodiment 4 is an EEL without a carrier confinement layer for the holes. Both Embodiment 24 and Comparative Embodiment 4 use an n type InP substrate. The material of the carrier confinement layer for the holes is n type InP (hereinafter referred to as a InP carrier confinement layer). The InP carrier confinement layer is disposed between the active layer and the lower photoelectric confinement layer, and one surface of the InP carrier confinement layer substantially contacts the active layer, that is, the active layer is formed directly on the InP carrier confinement layer. The material of the active layer is an aluminum-containing material and at least one portion of the lower photoelectric confinement layer substantially contacts the InP carrier confinement layer for the holes also include an aluminum-containing material. As shown in FIGS. 23 and 24, compared with Comparative Embodiment 4 without a carrier confinement layer for the holes, Embodiment 24 has improved capability of carrier confinement at room temperature and high temperature such that the optical power (optical output power) and slope efficiency (SE) have also been improved. The slope efficiency is the slope of optical power (optical output power) and current (W/A). In the embodiment 24, the lasing wavelength of laser diode is about 1310 nm. When the aluminum-containing material is used as the materials of the barrier layer and the well layer in the active layer, the conduction band discontinuity is relatively high, and the valence band discontinuity is relatively small. As such, the height of the electron barrier of the active layer containing aluminum is usually high, but the height of the hole barrier is low. As a consequence, the hole confinement of the active layer is poor. By providing a phosphorus-containing carrier confinement layer above or below the active layer, since the phosphorus-containing carrier confinement layer and the aluminum-containing active layer can form a larger valence band discontinuity, the height of the hole barrier can be increased, and the hole confinement of the active layer is improved. Embodiment 24 is to dispose the n type InP carrier confinement layer between the aluminum-containing active layer and the aluminum-containing lower photoelectric confinement layer such that the originally lower valence band discontinuity can be significantly increased to increase the height of the hole barrier. Accordingly, the hole confinement of the active layer is improved, and at the same time, the conduction band discontinuities formed between the phosphorus-containing carrier confinement layer and the aluminum-containing active layer and between the phosphorus-containing carrier confinement layer and the aluminum-containing lower photoelectric confinement layer are not too large. Therefore, the electrons can be injected into the active layer from the lower photoelectric confinement layer without hindrance such that the resistance is not easy to increase, thereby improving the performance of the semiconductor laser diode.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A vertical-cavity surface-emitting laser (VCSEL), comprising:
 a GaAs substrate; and
 a multi-layer structure on the GaAs substrate, wherein the multi-layer structure comprises:
 a lower epitaxial region, located on the GaAs substrate;
 an active region, located on the lower epitaxial region, wherein the active region comprises a first active layer, an epitaxial region and a second active layer, the epitaxial region is disposed between the first active layer and the second active layer, the first active layer comprises one or more quantum well structures or one or more quantum dot structures, and the second active layer comprises one or more quantum well structures or one or more quantum dot structures; and
 an upper epitaxial region, located on the active region, wherein the epitaxial region further comprises a tunnel junction and a hole blocking layer, the hole blocking layer is disposed between the tunnel junction and the first active layer or between the tunnel junction and the second active layer for blocking the holes in the first active layer or the second active layer from reaching the tunnel junction, and the hole blocking layer comprises a material selected from the group consisting of InGaAsP, InGaAsPN, InGaAsPSb, InGaAsPBi, InGaP, InGaPN, InGaPSb, InGaPBi and InAlGaAsP.

2. The VCSEL as claimed in claim 1, wherein the hole blocking layer is disposed in the epitaxial region and is adjacent to or substantially in contact with the first active layer or the second active layer.

3. The VCSEL as claimed in claim 1, wherein the epitaxial region further comprises a first surface, a second surface and an electron blocking layer, the first surface is a surface of the epitaxial region facing the first active layer, the second surface is a surface of the epitaxial region facing the second active layer, one surface of the hole blocking layer contacts the first active layer, and the electron blocking layer contacts the second active layer.

4. The VCSEL as claim in claim 1, wherein the active region further comprises an electron blocking layer, and the electron blocking layer comprises a material selected from the group consisting of AlGaAsP, AlGaAsPN, AlGaAsPSb, AlGaAsPBi, InAlGaP, InAlGaPN, InAlGaPSb, InAlGaPBi and InAlGaAsP for blocking the electrons from reaching the tunnel junction.

5. The VCSEL as claimed in claim 1, wherein the epitaxial region further comprises one spacer layer, the spacer layer is disposed between the first active layer and the tunnel junction, and the hole blocking layer is disposed in the spacer layer.

6. The VCSEL as claimed in claim 5, wherein the epitaxial region further comprises an oxidation layer, the spacer layer is disposed between the tunnel junction and the oxidation layer, between the tunnel junction and the first or second active layer adjacent to the tunnel junction, or between the oxidation layer and the first or second active layer adjacent to the oxidation layer.

7. The VCSEL as claimed in claim 1, wherein the epitaxial region further comprises one spacer layer, the spacer layer is disposed between the second active layer and the tunnel junction, and the hole blocking layer is disposed in the spacer layer.

8. The VCSEL as claimed in claim 1, wherein the epitaxial region further comprises an oxidation layer, and when the hole blocking layer is disposed between the first active layer and the tunnel junction, the oxidation layer is disposed between the second active layer and the tunnel junction.

9. The VCSEL as claimed in claim 1, wherein the epitaxial region further comprises an oxidation layer, and when the hole blocking layer is disposed between the second active layer and the tunnel junction, the oxidation layer is disposed between the first active layer and the tunnel junction.

10. A vertical-cavity surface-emitting laser (VCSEL), comprising:
an InP substrate; and
a multi-layer structure on the InP substrate, wherein the multi-layer structure comprises:
a lower epitaxial region, located on the InP substrate;
an active region, located on the lower epitaxial region, wherein the active region comprises a first active layer, an epitaxial region and a second active layer, the epitaxial region is disposed between the first active layer and the second active layer, the first active layer comprises one or more quantum well structures or one or more quantum dot structures, and the second active layer comprises one or more quantum well structures or one or more quantum dot structures; and
an upper epitaxial region, located on the active region,
wherein the epitaxial region further comprises a tunnel junction and a hole blocking layer, the hole blocking layer is disposed between the tunnel junction and the first active layer or between the tunnel junction and the second active layer for blocking the holes in the first active layer or the second active layer from reaching the tunnel junction, and the hole blocking layer comprises a material selected from the group consisting of InGaP, InAlGaP, InP, and InGaAsP.

11. The VCSEL as claimed in claim 10, wherein a PL peak wavelength of at least one InGaAsP hole blocking layer does not exceed 900 nm.

12. The VCSEL as claimed in claim 10, wherein the hole blocking layer is disposed in the epitaxial region and is adjacent to or substantially in contact with the first active layer or the second active layer.

13. The VCSEL as claimed in claim 10, wherein the epitaxial region further comprises a first surface, a second surface and an electron blocking layer, the first surface is a surface of the epitaxial region facing the first active layer, the second surface is a surface of the epitaxial region facing the second active layer, one surface of the hole blocking layer contacts the first surface, and the electron blocking layer contacts the second surface.

14. The VCSEL as claim in claim 10, wherein the active region further comprises an electron blocking layer, and the electron blocking layer comprises a material selected from the group consisting of InAlAsP, AlAsSb, AlAsBi, AlGaAsSb, AlGaAsBi, AlPSb and AlPBi for blocking the electrons from reaching the tunnel junction.

15. The VCSEL as claimed in claim 10, wherein the epitaxial region further comprises one spacer layer, the spacer layer is disposed between the first active layer and the tunnel junction, and the hole blocking layer is disposed in the spacer layer.

16. The VCSEL as claimed in claim 10, wherein the epitaxial region further comprises one spacer layer, the spacer layer is disposed between the second active layer and the tunnel junction, and the hole blocking layer is disposed in the spacer layer.

17. The VCSEL as claimed in claim 10, wherein the epitaxial region further comprises an oxidation layer, and when the hole blocking layer is disposed between the first active layer and the tunnel junction, the oxidation layer is disposed between the second active layer and the tunnel junction.

18. The VCSEL as claimed in claim 10, wherein the epitaxial region further comprises an oxidation layer, and when the hole blocking layer is disposed between the second active layer and the tunnel junction, the oxidation layer is disposed between the first active layer and the tunnel junction.

* * * * *